(12) United States Patent
Kang et al.

(10) Patent No.: US 11,899,892 B2
(45) Date of Patent: Feb. 13, 2024

(54) DISPLAY DEVICE

(71) Applicant: Samsung Display Co., LTD., Yongin-si (KR)

(72) Inventors: Bong Il Kang, Yongin-si (KR); Ga Yeon Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 17/688,927

(22) Filed: Mar. 8, 2022

(65) Prior Publication Data

US 2022/0391041 A1    Dec. 8, 2022

(30) Foreign Application Priority Data

Jun. 2, 2021  (KR) .................. 10-2021-0071812

(51) Int. Cl.
*G06F 3/044*  (2006.01)
*G06F 3/041*  (2006.01)
*H05K 1/02*  (2006.01)
*H05K 1/18*  (2006.01)

(52) U.S. Cl.
CPC .......... *G06F 3/0446* (2019.05); *G06F 3/0412* (2013.01); *H05K 1/028* (2013.01); *H05K 1/189* (2013.01); *G06F 2203/04102* (2013.01); *H05K 2201/10128* (2013.01)

(58) Field of Classification Search
CPC . G06F 2203/04102; G06F 2203/04107; G06F 2203/04112; G06F 3/0412; G06F 3/04164; G06F 3/0446; H05K 1/0215; H05K 1/028; H05K 1/189; H05K 2201/0979; H05K 2201/10128
See application file for complete search history.

(56) References Cited

U.S. PATENT DOCUMENTS

| 9,718,994 | B2 | 8/2017 | Lee et al. | |
| 2020/0192431 | A1* | 6/2020 | Shin | ........................ G06F 1/1652 |
| 2020/0301485 | A1* | 9/2020 | Shan | ...................... H05K 1/0215 |
| 2020/0341576 | A1 | 10/2020 | Kahng et al. | |

FOREIGN PATENT DOCUMENTS

| CN | 210606462 | 5/2020 |
| CN | 112183396 | 1/2021 |
| KR | 10-1511284 | 4/2015 |

* cited by examiner

*Primary Examiner* — Robin J Mishler
(74) *Attorney, Agent, or Firm* — H.C. Park & Associates, PLC

(57) ABSTRACT

A display device includes: a display panel including a display area in which pixels are provided, and a non-display area formed to enclose at least one side of the display area; a touch sensing layer disposed on the display panel, and including at least one first touch electrode and at least one second touch electrode; a printed circuit substrate connected to one side of the non-display area and electrically connected with the pixels; and conductive tape attached to one surface of the printed circuit substrate. The conductive tape may include first conductive tape and second conductive tape spaced apart from each other.

19 Claims, 12 Drawing Sheets

DISPLAY DEVICE

CROSS-REFERENCE TO RELATED APPLICATION

The application claims priority from and the benefit of Korean Patent Application No. 10-2021-0071812, filed on Jun. 2, 2021, which is hereby incorporated by reference for all purposes as if fully set forth herein.

BACKGROUND

Field

Embodiments of the invention relate generally to a display device, and more specifically, to a display device having a reduced defect rate.

Discussion of the Background

With an increase in interest in an information display and an increase in demand to use portable information media, demand for display devices is markedly increased, and commercialization thereof is in progress.

The above information disclosed in this Background section is only for understanding of the background of the inventive concepts, and, therefore, it may contain information that does not constitute prior art.

SUMMARY

Devices constructed according to illustrative implementations of the invention are capable of reducing an amount of noise that may cause ghost touch issues for the devices.

Various embodiments are directed to a display device capable of preventing a ghost touch form occurring, thus reducing a defect rate.

Additional features of the inventive concepts will be set forth in the description which follows, and in part will be apparent from the description, or may be learned by practice of the inventive concepts.

An embodiment may provide a display device including: a display panel including a display area in which a plurality of pixels are provided, and a non-display area formed to enclose at least one side of the display area; a touch sensing layer disposed on the display panel, and including at least one first touch electrode and at least one second touch electrode; a printed circuit substrate connected to one side of the non-display area and electrically connected with the plurality of pixels; and conductive tape attached to one surface of the printed circuit substrate. The conductive tape may include first conductive tape and second conductive tape spaced apart from each other.

In an embodiment, the printed circuit substrate may include: a base layer; a driving circuit mounted on the base layer and electrically connected with the first and the second touch electrodes; at least one ground terminal disposed on the base layer; at least one first signal line disposed on the base layer and configured to electrically connect the driving circuit with the first touch electrode; at least one second signal line disposed on the base layer and configured to electrically connect the driving circuit with the second touch electrode; at least one first guard line disposed on the base layer between the first signal line and the second signal line; and at least one first ground line electrically connected to the ground terminal.

In an embodiment, a gap between the first conductive tape and the second conductive tape may correspond to the first guard line.

In an embodiment, each of the first conductive tape and the second conductive tape may be electrically connected to the ground terminal.

In an embodiment, the first signal line, the second signal line, and the first guard line, and the first ground line may be electrically separated from each other.

In an embodiment, the touch sensing layer may include a touch sensing area in which the first and the second touch electrodes are disposed, and a touch peripheral area configured to enclose at least one side of the touch sensing area. At least one first sensing line electrically connected to the first touch electrode and the first signal line, at least one second sensing line electrically connected to the second touch electrode and the second signal line, at least one second guard line electrically connected to the first guard line, and at least one second ground line electrically connected to the first ground line may be disposed in the touch peripheral area.

In an embodiment, the first sensing line, the second sensing line, the second guard line, and the second ground line may be disposed in the touch peripheral area at positions spaced apart from each other.

In an embodiment, the first signal line and the second signal line may face each other with the first guard line interposed therebetween on the base layer. A distance between the first signal line and the second signal line with the first guard line interposed therebetween may be 50 μm or more.

In an embodiment, a gap between the first conductive tape and the second conductive tape may be 50 μm or more.

In an embodiment, the gap between the first conductive tape and the second conductive tape may be identical with or less than the distance between the first signal line and the second signal line with the first guard line interposed therebetween.

In an embodiment, the display panel may include: a substrate including a first surface and a second surface that face each other; the pixels disposed on the first surface of the substrate; and a cover panel disposed on the second surface of the substrate. Each of the first and the second conductive tape may be disposed between one surface of the cover panel and the printed circuit substrate.

In an embodiment, the printed circuit substrate may further include an insulating layer provided on the first and the second signal lines, the first guard line, and the first ground line.

In an embodiment, the conductive tape may further include third conductive tape spaced apart from the first and the second conductive tape. Each of the first to the third conductive tape may be electrically connected to the ground terminal.

In an embodiment, the conductive tape may further include fourth conductive tape spaced apart from the first to the third conductive tape. Each of the first to the fourth conductive tape may be electrically connected to the ground terminal.

In an embodiment, the printed circuit substrate may include a flexible printed circuit substrate.

In an embodiment, the display panel may include a first flat area, a second flat area, and a bending area.

In an embodiment, the display device may further include a passivation layer provided on an upper surface of the cover panel in the first flat area, and provided to face a rear surface of the cover panel in the second flat area.

In an embodiment, the display device may further include a cover spacer provided in the second flat area between the passivation layer and the cover panel.

In an embodiment, the bending area may be bent so that the printed circuit substrate is attached to the cover panel by the conductive tape.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
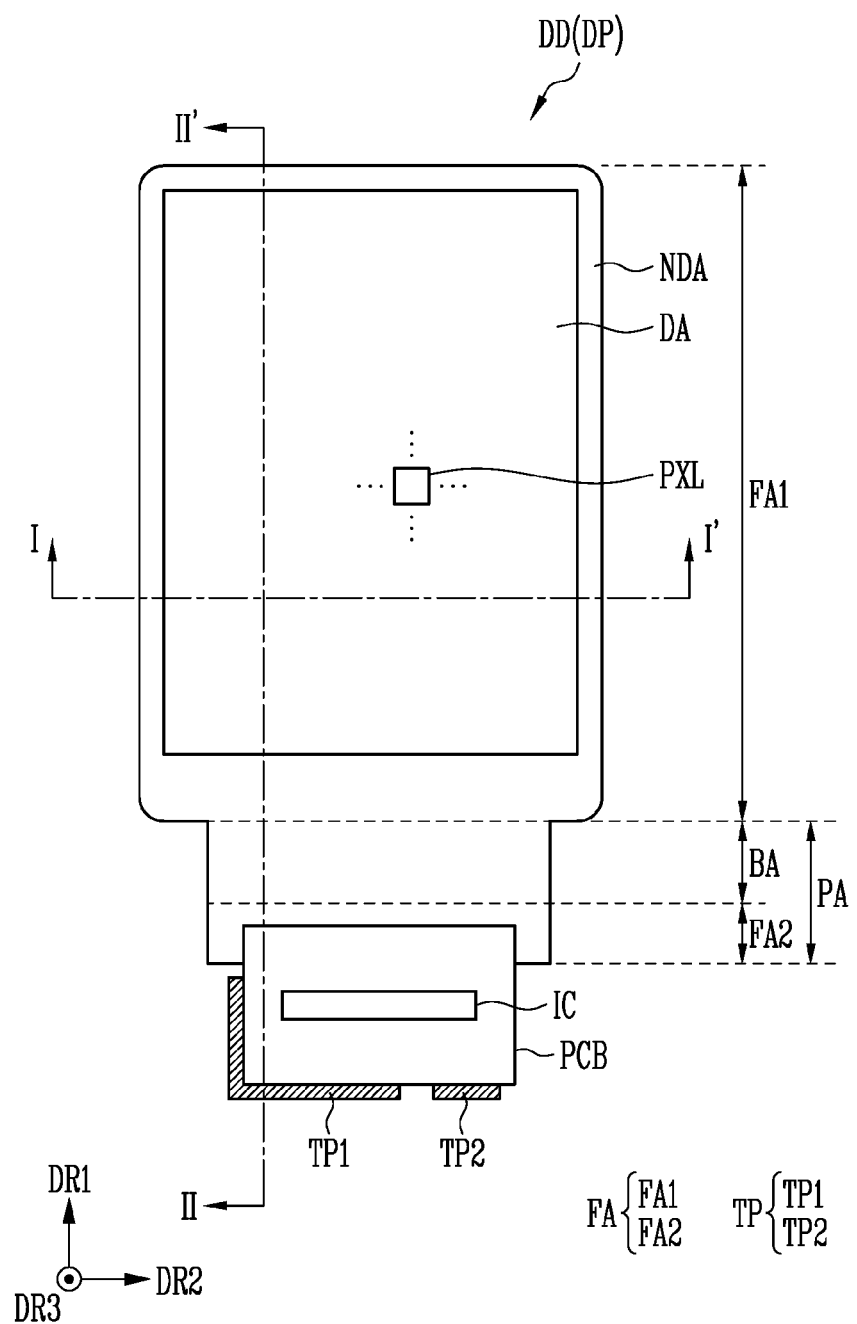
FIG. 1 is a schematic plan view illustrating a display device to which a printed circuit substrate and conductive tape are attached and that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
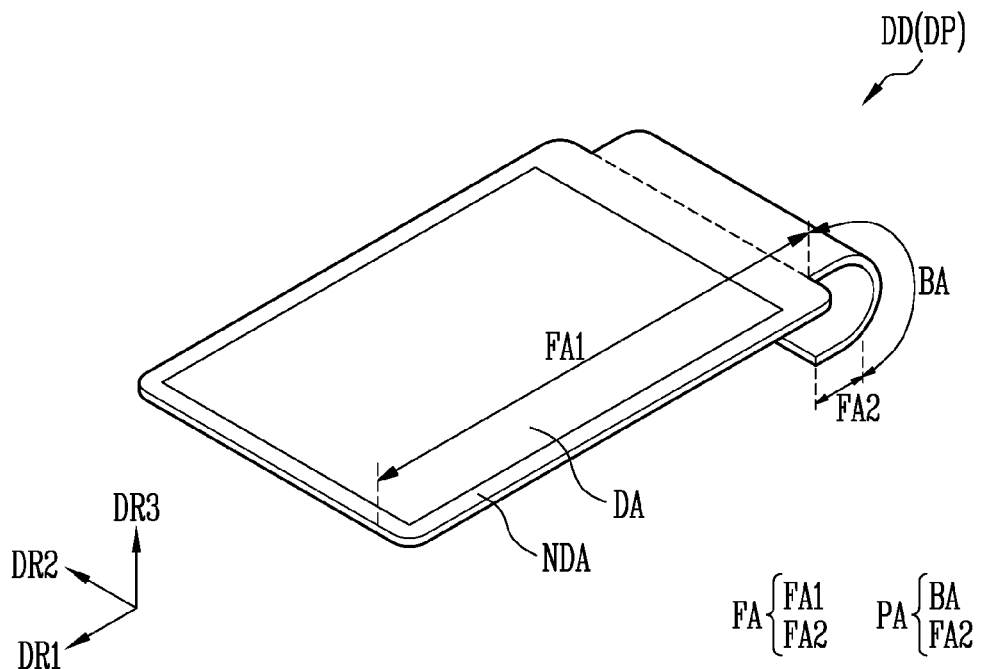
FIG. 2 is a schematic perspective view illustrating the display device in accordance with an embodiment.
Figure 3:
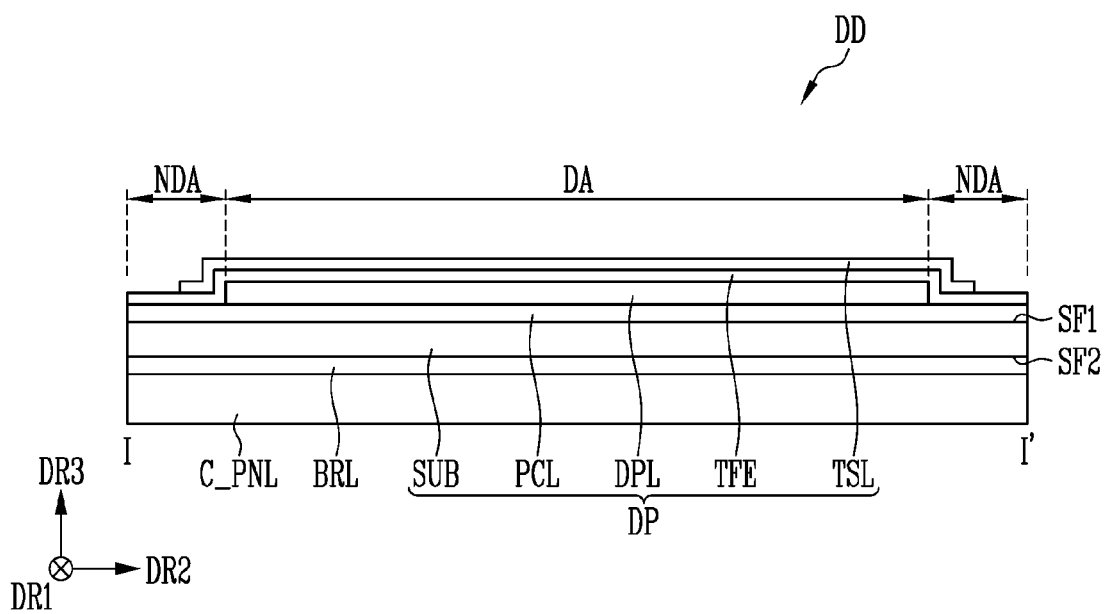
FIG. 3 is a sectional view taken along line I-I' of FIG. 1.

FIG. 1 is a schematic plan view illustrating a display device DD to which a printed circuit substrate PCB and conductive tape TP are attached, and which is constructed according to principles of the invention. FIG. 2 is a schematic perspective view illustrating the display device DD in accordance with an embodiment. FIG. 3 is a sectional view taken along line I-I' of FIG. 1.

In FIG. 1, for the sake of explanation, there is schematically illustrated the display device DD, particularly, the structure of a display panel DP provided in the display device DD, centered on a display area DA in which an image is displayed.

Referring to FIGS. 1 to 3, the display device DD in accordance with an embodiment may include the display panel DP, the printed circuit substrate PCB, and the conductive tape TP.

The display device DD may be provided in various forms, for example, in the form of a rectangular plate having two pairs of parallel sides. In the case where the display device DD is provided in the form of a rectangular plate, any one pair of sides of the two pairs of sides may be longer than the other pair of sides. In an embodiment, for the sake of explanation, there is illustrated the case where the display device DD has a rectangular shape with a pair of long sides and a pair of short sides. A direction in which the long sides extend is indicated by a first direction DR1, a direction in which the short sides extend is indicated by a second direction DR2, and a direction perpendicular to the directions in which the long sides and the short sides extend is indicated by a third direction DR3.

The display panel DP may display arbitrary visual information, e.g., a text, a video, a photograph, and a two- or three-dimensional image. Hereinafter, the arbitrary visual information will refer to "image". The type of display panel DP is not limited to a special type of display panel so long as it can display an image.

A self-emissive display panel, such as an organic light emitting display panel (OLED panel) using an organic light emitting diode as a light emitting element, a micro light emitting diode (LED) display panel using a micro LED as a light emitting element, and a quantum dot organic light emitting display panel (QD OLED panel) using a quantum dot and an organic light emitting diode, may be used as the display panel DP. In addition, a non-emissive display panel such as a liquid crystal display (LCD) panel, an electrophoretic display (EPD) panel, or an electrowetting display (EWD) panel may be used as the display panel DP. In case that the non-emissive display panel is used as the display panel DP, the display device DD may include a backlight unit configured to supply light to the display panel DP.

The display device DD (the display panel DP) may include a display area DA and a non-display area NDA.

The display area DA and the non-display area NDA of the display device DD may respectively correspond to the display area DA and the non-display area NDA of the display panel DP. For example, the display area DA of the display device DD may correspond to the display area DA of the display panel DP. The non-display area NDA of the display device DD may correspond to the non-display area NDA of the display panel DP. The display area DA and the non-display area NDA of the display device DD are not required to be equal to the display area DA and the non-display area NDA of the display device DD, and may be changed depending on the structure and/or design of the display panel DP.

In an embodiment, the display device DD may include a touch sensing area and a touch peripheral area. The display device DD may not only display an image through the touch sensing area but may also sense a touch input made on a display surface (or an input surface) or sense light that is incident from the front. The touch peripheral area may enclose the sensing area, but this is only for illustrative purposes, and the embodiment described herein is not limited thereto. In an embodiment, a partial area of the display area DA may correspond to the sensing area.

The display area DA may be an area which displays an image, and the non-display area NDA may be an area which does not display an image.

The display area DA may be an area in which pixels PXL are provided to display an image. For the sake of explanation, FIG. 1 illustrates only one pixel PXL, but substantially a plurality of pixels PXL may be provided in the display area DA.

Each of the pixels PXL refers to a smallest unit for displaying an image. The pixels PXL each may include a light emitting element which emits white light and/or color light. Each of the pixels PXL may emit any one color of red, green and blue, but the embodiment described herein is not limited thereto, and the pixel PXL may emit a color such as cyan, magenta or yellow.

The pixels PXL may be arranged in a matrix form along columns extending in the first direction DR1 and rows extending in the second direction DR2 intersecting with the first direction DR1. However, the arrangement of the pixels PXL is not limited to a particular arrangement. In other words, the pixels PXL may be arranged in various forms. Although FIG. 1 illustrates that the pixels PXL each have a rectangular shape, the embodiment described herein is not limited thereto. The pixel PXL may have various shapes. Furthermore, in case that a plurality of pixels PXL are provided, the pixels PXL may have different surface areas (or different sizes). For example, in case that pixels PXL emit different colors of light, the pixels PXL may have different surface areas (or different sizes) or different shapes by colors.

The non-display area NDA may be provided on at least one side of the display panel DP. The embodiment described herein is not limited thereto. In an embodiment, the shape of the display area DA and the shape of the non-display area NDA may be designed to be relative to each other.

The non-display area NDA may include a protrusion area PA which protrudes from a portion of the non-display area NDA in at least one direction. The protrusion area PA may protrude from the sides that define the non-display area NDA.

The printed circuit substrate PCB may be attached to at least one side of the protrusion area PA. Hence, the printed circuit substrate PCB may be electrically connected with the display panel DP. For example, components (e.g., circuit elements and lines) of the printed circuit substrate PCB may be electrically connected with components (e.g., circuit elements and lines) disposed in the protrusion area PA.

In an embodiment, the display device DD (or the display panel DP) may have flexibility in at least a portion thereof.

The display device DD may be folded on the portion having the flexibility. In an embodiment, the term "fold" refers to the fact that the display device may be changed from the original shape thereof to another shape without being fixed in shape, and may have meanings including, being "folded" or "curved" along at least one specific line, i.e., a folding line, or "rolled" in a scroll manner.

The display device DD (or the display panel DP) may include a bending area BA which has flexibility and is folded in one direction, and a flat area FA which is successive to at least one side of the bending area BA and is planar rather than being folded. The flat area FA may have flexibility or may not have flexibility.

The bending area BA may be provided in the non-display area NDA, but the embodiment described herein is not limited thereto. The bending area BA may be provided in the display area DA.

The flat area FA may include a first flat area FA1 and a second flat area FA2 which are spaced apart from each other with the bending area BA interposed therebetween. The first flat area FA1 may be provided in the display area DA and at least a portion of the non-display area NDA. The bending area BA may be successive to the first flat area FA1 and be provided in the non-display area NDA. The second flat area FA2 may be successive to the bending area BA and be provided in the non-display area NDA. The bending area BA and the second flat area FA2 may be provided in the protrusion area PA of the non-display area NDA.

One surface of the first flat area FA1 and one surface of the second flat area FA2 may be disposed to be parallel to each other and be folded to face each other, but the embodiment described herein is not limited thereto. In an embodiment, the surfaces of the first and second flat areas FA1 and FA2 may be folded to have a predetermined angle (e.g., an acute angle, the right angle, or an obtuse angle) therebetween, with the bending area BA interposed therebetween.

In an embodiment, the protrusion area PA of the non-display area NDA may bend along a folding line. Since the protrusion area PA bends, a bezel may be reduced in width.

As illustrated in FIG. 3, the display device DD may include the display panel DP, a passivation layer BRL, and a cover panel C_PNL.

The display panel DP may include a substrate SUB, a pixel circuit layer PCL provided on the substrate SUB, a display element layer DPL provided on the pixel circuit layer PCL, an encapsulation layer TFE provided on the display element layer DPL, and a touch sensing layer TSL provided on the encapsulation layer TFE.

The substrate SUB may be made of insulating material such as glass or resin. Furthermore, the substrate SUB may be made of material having flexibility so as to be bendable or foldable, and have a single- or multi-layer structure. For instance, examples of the material having flexibility may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and glass. However, the material constituting the substrate SUB may be changed in various ways, and the substrate SUB may also be made of fiber glass reinforced plastic (FRP) or the like.

The substrate SUB may include a first surface SF1 and a second surface SF2 which face each other. In a sectional view, the first surface SF1 may be an upper surface of the substrate SUB, and the second surface SF2 may be a lower surface of the substrate SUB. The pixel circuit layer PCL may be provided and/or formed on the first surface SF1 of the substrate SUB. The passivation layer BRL may be provided and/or formed on the second surface SF2 of the substrate SUB with the cover panel C_PNL interposed therebetween.

The pixel circuit layer PCL may include a plurality of insulating layers (not illustrated), a plurality of conductive layers (not illustrated), and a semiconductor layer (not illustrated). The plurality of conductive layers of the pixel circuit layer PCL may form signal lines or a pixel driving circuit.

The display element layer DPL may include a light emitting element (not illustrated) configured to emit light.

The encapsulation layer TFE may encapsulate the display element layer DPL. The encapsulation layer TFE may be formed of a single layer or multiple layers. The encapsulation layer TFE may include a plurality of insulating layers configured to cover the light emitting element. In an embodiment, the encapsulation layer TFE may include at least one inorganic layer and at least one organic layer. For example, the encapsulation layer TFE may have a structure formed by alternately stacking inorganic layers and organic layers. In some embodiments, the encapsulation layer TFE may be an encapsulation substrate which is disposed on the display element layer DPL and joined to the substrate SUB by a sealant.

The touch sensor layer TS may be directly disposed on a surface of the display panel DP from which an image is displayed, and be configured to receive a touch input of the user. Detailed description of the touch sensing layer TSL will be made below with reference to FIG. 4.

The passivation layer BRL may be disposed on one surface of the display panel DP, e.g., on the second surface SF2 of the substrate SUB. The passivation layer BRL may absorb and/or disperse external impact applied to the display panel DP, and protect the display panel DP. The passivation layer BRL may prevent external water, oxygen, etc. from penetrating the display panel DP.

The passivation layer BRL may be provided in the form of a plastic film including at least one organic layer. For example, the plastic film may be made of material having high transparency and excellent thermal insulation ability, e.g., at least one of thermoplastic polymer resin such as polycarbonate (PC), polyimide (PI), polyethersulfone (PES), polyarylate (PAR), polyethylene naphthalate (PEN), polyethylene terephthalate (PET), or cycloolefin copolymer, and thermosetting polymer resin such as epoxy, unsaturated polyester, phenolic foam (PF), silicon, or polyurethane. In an embodiment, the passivation layer BRL is not limited to the foregoing materials, and may be made of appropriate material selected depending on design conditions of the display panel DP among materials capable of protecting the substrate SUB disposed thereover.

In some implementations of the embodiments described herein, the passivation layer BRL may be omitted.

The cover panel C_PNL may be disposed on the passivation layer BRL on the second surface SF2 of the substrate SUB. For example, the cover panel C_PNL may be formed and/or provided on a rear surface (or a lower surface) of the passivation layer BRL. Here, the rear surface (or the lower surface) of the passivation layer BRL may refer to a surface on which the display panel DP is not provided. An adhesive layer (or a bonding layer) may be included between the passivation layer BRL and the cover panel C_PNL. The passivation layer BRL and the cover panel C_PNL may be more reliably coupled (or attached) to each other by the adhesive layer.

The cover panel C_PNL may be made of conductive material, and protect the passivation layer BRL from external impact or the like. In an embodiment, the cover panel C_PNL may include a heat dissipation layer and a cushion layer.

The heat dissipation layer may dissipate heat generated from heat generation components disposed adjacent thereto. Hence, the heat generation components that are disposed adjacent to the heat dissipation layer may easily dissipate heat generated during a driving process, and thus be reliably driven even if driving time passes.

The cushion layer may function to mitigate external impact, and include elastically deformable material. For example, the cushion layer may include thermoplastic elastomer, polystyrene, polyolefin, polyurethane thermoplastic elastomers, polyamides, synthetic rubbers, polydimethylsiloxane, polybutadiene, polyisobutylene, poly(styrene-butadienestyrene), polyurethanes, polychloroprene, polyethylene, silicone, and a combination thereof, but the embodiment described herein is not limited to the foregoing examples. For instance, the cushion layer may include suitable material selected from among materials having elasticity within a range in which the material does not affect image display performance of the display panel DP.

The cushion layer may be formed of a signal layer, but the embodiment described herein is not limited thereto. The cushion may have a multilayer structure formed by stacking a plurality of separate layers.

The printed circuit board PCB may be a flexible printed circuit board, a printed circuit board, or a flexible film such as a chip on film.

The driving circuit IC may be mounted on the printed circuit substrate PCB. The driving circuit IC may include a touch driving circuit and/or a display panel driving circuit. In an embodiment, the driving circuit IC may be an integrated circuit (IC).

The conductive tape TP may be attached to one surface of the printed circuit substrate PCB.

The conductive tape TP may be an anisotropic conductive film and have adhesiveness (bonding ability). The conductive tape TP may be formed by coating conductive fiber, a metal foil, etc. with a conductive adhesive agent. In this case, the conductive tape TP may have excellent electrical conductivity and high electromagnetic shielding effect. The conductive tape TP having a fiber type may have high flexibility. In an embodiment, the conductive tape TP may have adhesiveness on one side or both sides. In an embodiment, the conductive tape TP may be a ground of some components of the display panel DP and/or some components of the printed circuit substrate PCB.

The conductive tape TP may include first conductive tape TP1 and second conductive tape TP2 which are spaced apart from each other in one direction, e.g., the second direction DR2. The first conductive tape TP1 and the second conductive tape TP2 may include identical material and be disposed on one surface (or a rear surface) of the printed circuit substrate PCB. Furthermore, the first conductive tape TP1 and the second conductive tape TP2 may be attached to a component disposed on a rear surface of the display panel DP, e.g., to the cover panel C_PNL of the display panel DP, when the display panel DP is bent. In an embodiment, when the display panel DP is bent, the first conductive tape TP1 and the second conductive tape TP2 may be disposed between the printed circuit substrate PCB and the cover panel C_PNL and thus couple the printed circuit substrate PCB with the cover panel C_PNL.

Although FIGS. 1 and 3 illustrate that the conductive tape TP includes the first conductive tape TP1 and the second conductive tape TP2 that are separated from each other in one direction and disposed at positions spaced apart from each other, embodiment described herein is not limited thereto. In an embodiment, the conductive tape TP may include a plurality of pieces of conductive tape TP which are separated in several directions and spaced apart from each other. Detailed descriptions pertaining thereto will be made with reference to FIGS. 9 to 11.

Figure 4:
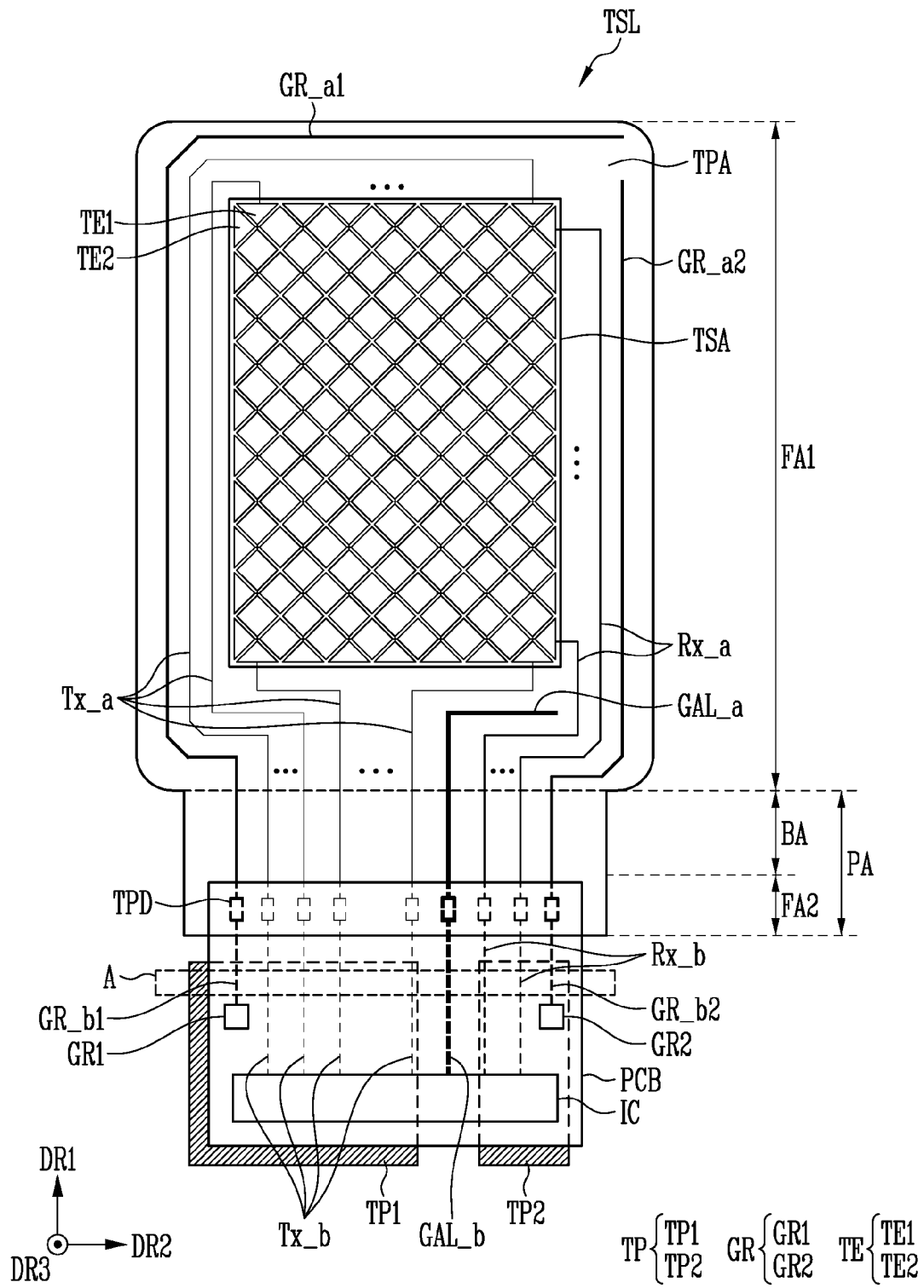
FIG. 4 is a schematic plan view illustrating a touch sensing layer illustrated in FIG. 2 and a printed circuit substrate attached with conductive tape.

FIG. 4 is a schematic plan view illustrating the touch sensing layer illustrated in FIG. 3 and the printed circuit substrate PCB attached with the conductive tape TP.

Referring to FIG. 4, the touch sensing layer TSL may be disposed on a surface of the display panel DP on which an image is displayed, and be configured to receive a touch input of the user. The touch sensing layer TSL may recognize a touch event of the display device DD through the hand of the user, a separate input device, or the like. For example, the touch sensing layer TSL may recognize a touch event in a capacitive manner. The touch sensing layer TSL may sense a touch of the use in a self-capacitance manner or a mutual capacitance manner.

The touch sensing layer TSL may include a touch sensing area TSA formed to sense a touch of the user, and a touch peripheral area TPA formed around the touch sensing area TSA.

The touch sensing area TSA may overlap the display area DA of the display panel DP and have substantially the same shape as that of the display area DA. The touch peripheral area TPA may overlap the non-display area NDA of the display panel DP.

A plurality of touch electrodes TE and connection electrodes configured to connect the touch electrodes TE may be disposed in the touch sensing area TSA.

The first touch electrode TE1 and the second touch electrode TE2 may be spaced apart from each other. A plurality of first touch electrodes TE1 may be arranged in the first direction DR1 and form a plurality of touch columns. A plurality of second touch electrodes TE2 may be arranged in the second direction DR2 and form a plurality of touch rows. In each of the plurality of touch columns, a plurality of first touch electrodes TE1 arranged in the first direction DR1 may be electrically connected by a connection electrode. In each of the plurality of touch rows, a plurality of second touch electrodes TE2 arranged in the second direction DR2 may be electrically connected by a connection electrode. In an embodiment, the first touch electrodes TE1 and the second touch electrodes TE2 may be disposed on an identical layer. The connection electrodes may be disposed on a layer different from that of the first touch electrodes TE1 and the second touch electrodes TE2, but the embodiment described herein is not limited thereto.

The touch electrode TE may be implemented in various shapes such as a diamond shape, a rectangular shape, or a triangular shape, in a plan view. For example, each of the touch electrodes TE disposed in the perimeter of the touch sensing area TSA may be implemented in a triangular shape in a plan view, and each of the other touch electrodes TE may be implemented in a diamond shape in a plan view, but the embodiment described herein is not limited thereto.

In an embodiment, each of the first touch electrodes TE1 and the second touch electrodes TE2 may have a mesh structure including a plurality of conductive fine lines. In case that the first touch electrodes TE1 and the second touch electrodes TE2 each have a mesh structure, the surface area of an overlapping portion between the first touch electrodes TE1 and the second touch electrodes TE2 may be reduced, so that a parasitic capacitance formed between the first and second touch electrodes TE1 and TE2 and electrodes of the display panel DP may be reduced.

In the touch peripheral area TPA, there may be disposed at least one or more first sensing lines Tx_a, at least one or more second sensing lines Rx_a, at least one or more second and fourth ground lines GR_a1 and GR_a2, at least one or more second guard lines GAL_a, and at least one or more touch electrode pads TPD.

A first end of each of the first sensing lines Tx_a may be connected to one side of the corresponding first touch electrode TE1. Second ends of the first sensing lines Tx_a may be connected to some of the touch electrode pads TPD. In other words, each first sensing line Tx_a may function to connect the corresponding first touch electrode TE1 with the corresponding touch electrode pad TPD.

A first end of each of the second sensing lines Rx_a may be connected to one side of the corresponding second touch electrode TE2. Second ends of the second sensing lines Rx_a may be connected to some of the touch electrode pads TPD. In other words, each second sensing line Rx_a may function to connect the corresponding second touch electrode TE2 with the corresponding touch electrode pad TPD.

The second and fourth ground lines GR_a1 and GR_a2 may be disposed outside the first sensing lines Tx_a or the second sensing lines Rx_a.

For example, the second ground line GR_a1 may be disposed outside the first sensing lines Tx_a. A first end of the second ground line GR_a1 may be connected to the corresponding touch electrode pad TPD. The fourth ground line GR_a2 may be disposed outside the second sensing lines Rx_a. A first end of the fourth ground line GR_a2 may be connected to the corresponding touch electrode pad TPD.

The second guard lines GAL_a may be disposed between the first sensing lines Tx_a and the second sensing lines Rx_a or the second or fourth ground line GR_a1 or GR_a2.

For example, the second guard line GAL_a may be disposed between the first sensing lines Tx_a and the second sensing lines Rx_a, and a first end of the second guard line GAL_a may be connected to the corresponding touch electrode pad TPD. Hence, the second guard line GAL_a may function to minimize a coupling between the first sensing lines Tx_a and the second sensing lines Rx_a and prevent a defect from occurring due to static electricity.

Although FIG. 4 illustrates that only one second guard line GAL_a is disposed in the touch peripheral area TPA, the embodiment described herein is not limited thereto. In an embodiment, a plurality of guard lines may be disposed around the touch peripheral area TPA.

The touch peripheral area TPA may include a protrusion area PA which protrudes from a portion of the touch peripheral area TPA in at least one direction. The protrusion area PA may protrude from the sides that define the touch peripheral area TPA.

The printed circuit substrate PCB may be attached to one side of the protrusion area PA and electrically connected with the touch sensing layer TSL. The printed circuit substrate PCB may include at least one or more first sensing lines Tx_b, at least one or more second sensing lines Rx_b, at least one or more first and third ground lines GR_b1 and GR_b2, at least one or more first guard lines GAL_b, at least one or more ground terminals GR, and a driving circuit IC.

The printed circuit substrate PCB may be attached to the protrusion area PA of the touch peripheral area TPA. In this case, the printed circuit substrate PCB may be electrically connected with the touch electrode pads TPD disposed in the protrusion area PA.

Hence, the first signal lines Tx_b may be electrically connected with the first sensing lines Tx_a by the corresponding touch electrode pads TPD. The second signal lines Rx_b may be electrically connected with the second sensing lines Rx_a by the corresponding touch electrode pads TPD. The first ground line GR_b1 may be electrically connected with the second ground line GR_a1 through the corresponding touch electrode pad TDP. The third ground line GR_b2 may be electrically connected with the fourth ground line GR_a2 through the corresponding touch electrode pad TDP. Furthermore, the first guard line GAL_b may be electrically connected with the second guard line GAL_a by the corresponding touch electrode pad TPD.

The ground terminals GR may include a first ground terminal GR1 and a second ground terminal GR2. The first ground line GR_b1 may be electrically connected with the first ground terminal GR1. The third ground line GR_b2 may be electrically connected with the second ground terminal GR2.

The first ground terminal GR1 may be formed at a position corresponding to the first conductive tape TP1 and electrically connected with the printed circuit substrate PCB, the first conductive tape TP1, and the cover panel C_PNL. The second ground terminal GR2 may be formed at a position corresponding to the second conductive tape TP2 and electrically connected with the printed circuit substrate PCB, the second conductive tape TP2, and the cover panel C_PNL.

A ground voltage may be applied to the first ground terminal GR1 and the second ground terminal GR2. Hence, in case that external static electricity is applied display device DD, the static electricity may be discharged to the first ground terminal GR1 and the second ground terminal GR2.

Although FIG. 4 illustrates that only two ground terminals, i.e., the first ground terminal GR1 and the second ground terminal GR2, are disposed on the printed circuit substrate PCB, the embodiment described herein is not limited thereto. In an embodiment, a plurality of ground terminals GR may be disposed on the printed circuit substrate PCB.

In an embodiment, the driving circuit IC may be disposed on the printed circuit substrate PCB as a touch driving circuit. The driving circuit IC may be formed of an integrated circuit and mounted on the printed circuit substrate PCB.

The first signal lines Tx_b, the second signal lines Rx_b, and the first guard line GAL_b each may be electrically connected with the driving circuit IC.

Hereinafter, the term "lines" or "line component" will be used to collectively designate all of the first and second sensing lines Tx_a and Rx_a, the first and second signal lines Tx_b and Rx_b, first to fourth ground lines GR_b1, GR_a1, GR_b2, and GR_a2, and the first and second guard lines GAL_b and GAL_a.

The touch electrodes TE and the lines Tx_a, Rx_a, Tx_b, Rx_b, GR_b1, GR_a1, GR_b2, GR_a2, GAL_b, and GAL_a each may have a single-layer or multilayer structure. The touch electrodes TE and the lines Tx_a, Rx_a, Tx_b, Rx_b, GR_b1, GR_a1, GR_b2, GR_a2, GAL_b, and GAL_a may include indium tin oxide (ITO), indium zinc oxide (IZO), zinc oxide (ZnO), indium tin zinc oxide (ITZO), PEDOT, metal nanowires, and/or graphene. The touch electrodes TE and the lines Tx_a, Rx_a, Tx_b, Rx_b, GR_b1, GR_a1, GR_b2, GR_a2, GAL_b, and GAL_a each may include metal, e.g., molybdenum, silver, titanium, copper, aluminum, or an alloy thereof. The touch electrodes TE and the lines Tx_a, Rx_a, Tx_b, Rx_b, GR_b1, GR_a1, GR_b2, GR_a2, GAL_b, and GAL_a may be provided on an identical layer or different layers.

Figure 5:
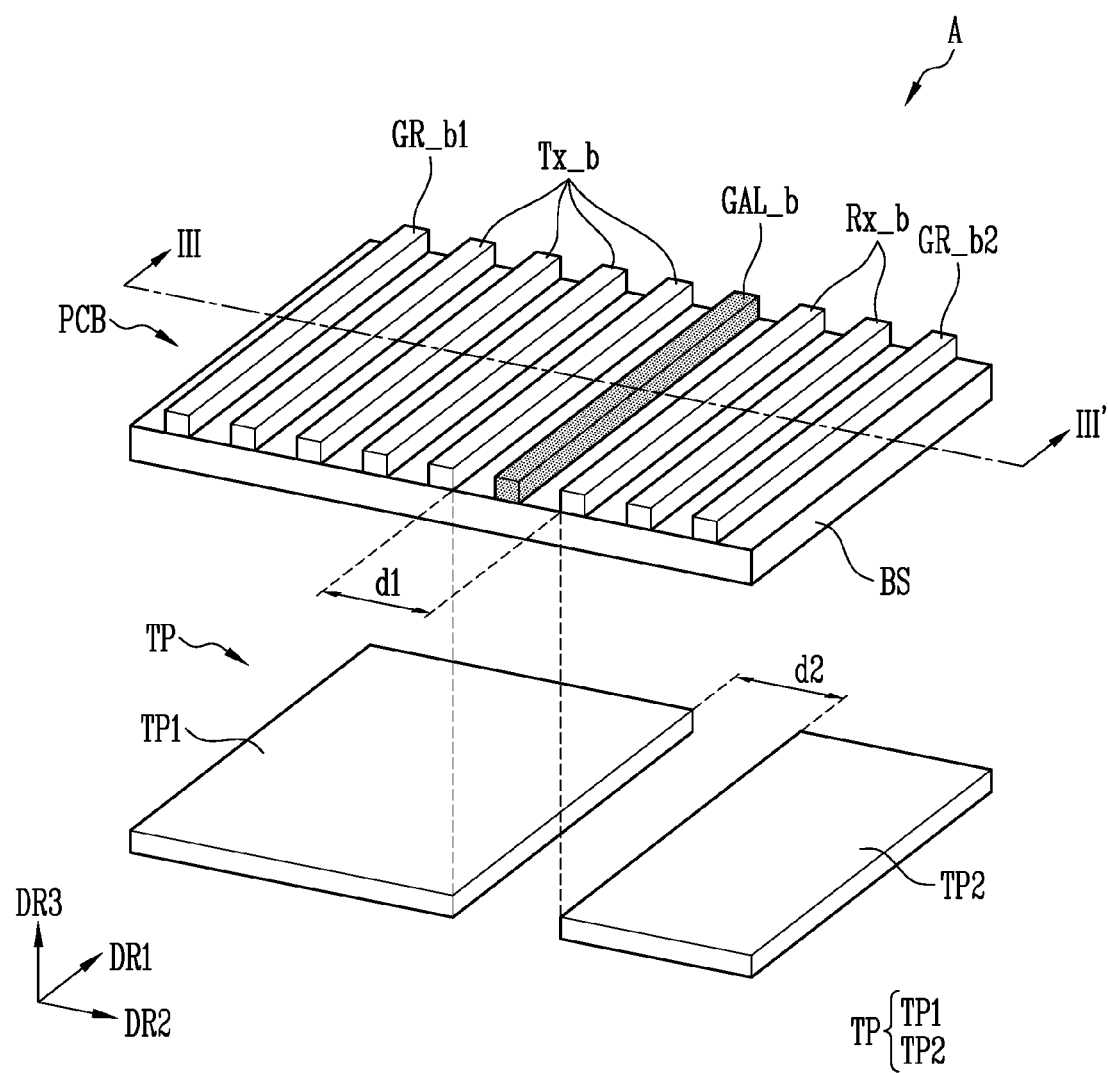
FIG. 5 is a schematic perspective view illustrating an enlargement of area A of FIG. 4.

FIG. 5 is a schematic perspective view illustrating an enlargement of area A of FIG. 4.

Referring to FIGS. 4 and 5, the first conductive tape TP1 and the second conductive tape TP2 in accordance with an embodiment may be spaced apart from each other in one direction (e.g., the second direction DR2) based on a portion corresponding to the first guard line GAL_b. Furthermore, the first conductive tape TP1 and the second conductive tape TP2 may be respectively electrically connected to the first ground terminal GR1 and the second ground terminal GR2. For example, the first conductive tape TP1 may be electrically connected with the first ground terminal GR1. The second conductive tape TP2 may be electrically connected with the second ground terminal GR2.

The first conductive tape TP1 may be disposed on one surface of a portion of the printed circuit substrate PCB that corresponds to the first signal lines Tx_b. The second conductive tape TP2 may be disposed on one surface of a portion of the printed circuit substrate PCB that corresponds to the second signal lines Rx_b.

The first conductive tape TP1 and the second conductive tape TP2 may be separated from each other with a constant gap (or space) d2. The gap d2 between the first conductive tape TP1 and the second conductive tape TP2 may correspond to a distance d1 between the first signal lines Tx_b and the second signal lines Rx_b with the first guard line GAL_b interposed therebetween.

If the conductive tape TP is detached from the printed circuit substrate PCB (or detached from the ground terminal GR of the printed circuit substrate PCB) rather than being attached to the printed circuit substrate PCB, the conductive tape TP may be a floating metal layer, so that the ground of the touch sensing layer TSL may undesirably move rather than being stationary. In this case, a predetermined signal (or a sensing signal) output from the first touch electrode TE1 to the first signal line Tx_b of the printed circuit substrate PCB may be applied to the conductive tape TP that is a floating metal layer and then be transmitted to the second signal line Rx_b of the printed circuit substrate PCB. The predetermined signal transmitted to the second signal line Rx_b may generate an undesired noise. Such a noise may cause a ghost touch (that is, the device detects that a touch has been made to a display screen of the device, when in fact no touch has been made by the user), so that the display device may recognize that the user has input a touch even though the user has not made a touch input. Hence, a malfunction of the touch sensing layer TSL may be caused, so that the reliability of the display device DD may be reduced.

In an embodiment, the conductive tape TP is divided into the first conductive tape TP1 and the second conductive tape TP2 that are spaced apart from each other, so that even if as described above the conductive tape TP becomes a floating metal layer and undesired noise occurs, the noise may be mitigated by the gap d2 between the first conductive tape TP1 and the second conductive tape TP2. For example, since a predetermined signal transmitted from the first sensing line Tx_a to the first conductive tape TP1 is mitigated by the gap d2 between the first conductive tape TP1 and the second conductive tape TP2, the magnitude of a signal to be transmitted to the second sensing line Rx_a through the second conductive tape TP2 may be reduced. Hence, a ghost touch that may be caused by noise may be reduced or prevented.

Furthermore, when the conductive tape TP is divided into the first conductive tape TP1 and the second conductive tape TP2, the first conductive tape TP1 and the second conductive tape TP2 are spaced apart from each other based on the portion corresponding to the first guard line GAL_b. Therefore, noise may be prevented from occurring from the gap d2 between the first conductive tape TP1 and the second conductive tape TP2.

Hence, in the display device DD in accordance with the embodiments described herein, even if the conductive tape TP is detached from the printed circuit substrate PCB (or detached from the ground terminal GR of the printed circuit substrate PCB) rather than being attached to the printed circuit substrate PCB, and thus the conductive tape TP becomes a floating metal layer, and the ground of the touch sensing layer TSL undesirably moves rather than being stationary, the probability of occurrence of a touch error may be reduced.

The gap d2 between the first conductive tape TP1 and the second conductive tape TP2 may be identical with or different from the distance d1 between the first signal line Tx_b and the second signal line Rx_b with the first guard line GAL_b interposed therebetween. The gap d2 between the first conductive tape TP1 and the second conductive tape TP2 may be identical with or less than the distance d1 between the first signal line Tx_b and the second signal line Rx_b with the first guard line GAL_b interposed therebetween.

The distance d1 between the first signal line Tx_b and the second signal line Rx_b with the first guard line GAL_b interposed therebetween may be 50 µm or more, and, corresponding thereto, the gap d2 between the first conductive tape TP1 and the second conductive tape TP2 may also be 50 µm or more.

As the gap d2 between the first conductive tape TP1 and the second conductive tape TP2 increases, the magnitude of a signal transferred from the first signal line Tx_b may be reduced. Therefore, the distance d1 between the first signal line Tx_b and the second signal line Rx_b with the first guard line GAL_b interposed therebetween and, corresponding thereto, the gap d2 between the first conductive tape TP1 and the second conductive tape TP2 may be sufficiently large. Since the gap d2 between the first conductive tape TP1 and the second conductive tape TP2 is sufficiently large, the ghost touch may be further reduced.

In an embodiment, the gap d2 between the first conductive tape TP1 and the second conductive tape TP2 may be identical with or less than the distance d1 between the first signal line Tx_b and the second signal line Rx_b with the first guard line GAL_b interposed therebetween. Furthermore, since the magnitude of a signal transferred from the first signal line Tx_b may be reduced as the gap d2 between the first conductive tape TP1 and the second conductive tape TP2 increases, it is desirable that the gap d2 between the first conductive tape TP1 and the second conductive tape TP2 be identical with the distance d1 between the first signal line Tx_b and the second signal line Rx_b with the first guard line GAL_b interposed therebetween. Consequently, the ghost touch may be further reduced.

Figure 6:
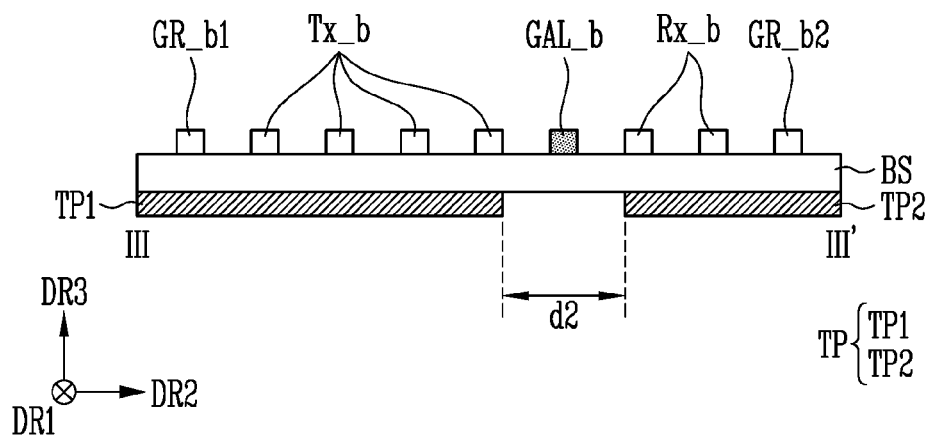
FIG. 6 is a sectional view taken along line III-III' of FIG. 5.
Figure 7:
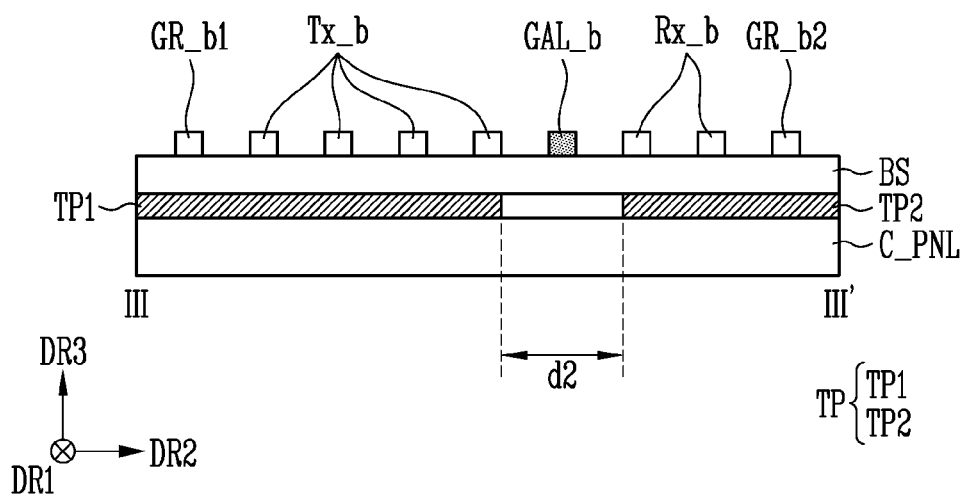
FIG. 7 is a sectional view illustrating a cover panel that is attached to the printed circuit substrate and the conductive tape that are illustrated in FIG. 6.
Figure 8:
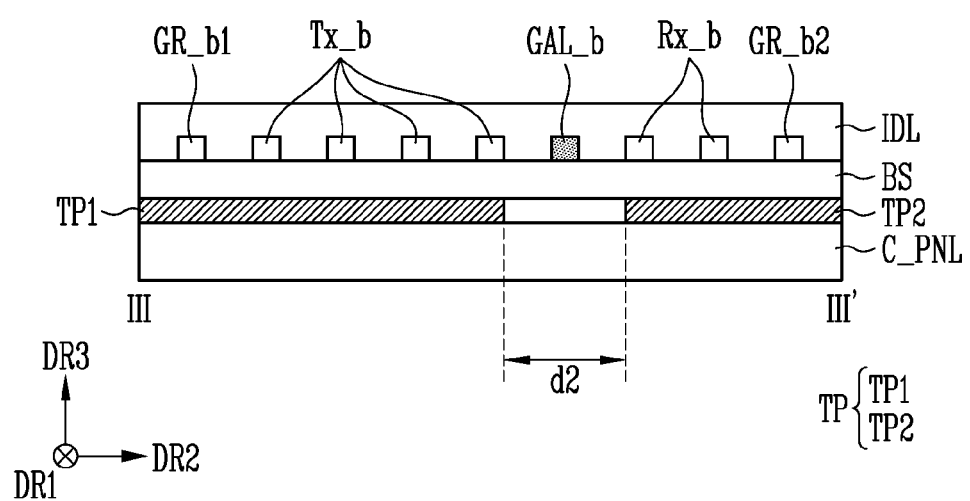
FIG. 8 is a sectional view illustrating an insulating layer which is further disposed on the printed circuit substrate shown in FIG. 7.

FIG. 6 is a sectional view taken along line III-III' of FIG. 5. FIG. 7 is a sectional view illustrating the cover panel C_PNL that is attached to the printed circuit substrate PCB and the conductive tape TP that are illustrated in FIG. 6. FIG. 8 is a sectional view illustrating an insulating layer IDL which is further disposed on the printed circuit substrate PCB shown in FIG. 7.

Referring to FIGS. 6 and 7, the printed circuit substrate PCB attached with the conductive tape TP in accordance with an embodiment may include a base substrate BS which is disposed under the first and second signal lines Tx_b and Rx_b, the first and third ground lines GR_b1 and GR_b2, and the first guard line GAL_b.

The first and second signal lines Tx_b and Rx_b, the first and third ground lines GR_b1 and GR_b2, and the first guard line GAL_b may be directly disposed on the base substrate B S.

The base substrate SUB may be made of material having flexibility so as to be bendable or foldable, and have a single-layer or multilayer structure. For instance, examples of the material having flexibility may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be changed in various ways, and the substrate SUB may also be made of fiber glass reinforced plastic (FRP) or the like.

The conductive tape TP may be attached to a lower surface of the base substrate BS.

Referring to FIGS. 6 and 8, the printed circuit substrate PCB attached with the conductive tape TP in accordance with an embodiment may further include the insulating layer IDL which is disposed over the first and second signal lines Tx_b and Rx_b, the first and third ground lines GR_b1 and GR_b2, and the first guard line GAL_b.

In an embodiment, the insulating layer IDL may be an uppermost layer of the printed circuit substrate PCB. In an embodiment, the insulating layer IDL may be an additional inorganic layer (or an additional inorganic buffer layer) disposed on the printed circuit substrate PCB.

The insulating layer IDL may be formed of an inorganic insulating layer including inorganic material or an organic insulating layer including organic material. The inorganic material may include at least one of aluminum oxide, titanium oxide, silicon oxide, silicon nitride, silicon oxynitride, zirconium oxide, and hafnium oxide. The organic material may include at least one of acryl, polyimide (PI), polyamide (PA), and benzocyclobutene (BCB). The insulating layer IDL formed of an organic insulating layer may be transparent and flexible, thus making it possible to mitigate unevenness of a lower structure provided under the insulating layer IDL and planarize the lower structure.

The insulating layer IDL may prevent the first and second signal lines Tx_b and Rx_b, the first and third ground lines GR_b1 and GR_b2, and the first guard line GAL_b from being exposed to the outside and prevent the first and second signal lines Tx_b and Rx_b, the first and third ground lines GR_b1 and GR_b2, and the first guard line GAL_b from being corroded. Furthermore, the insulating layer IDL may cover the printed circuit substrate PCB and function to protect the printed circuit substrate PCB from the outside.

Figure 9:
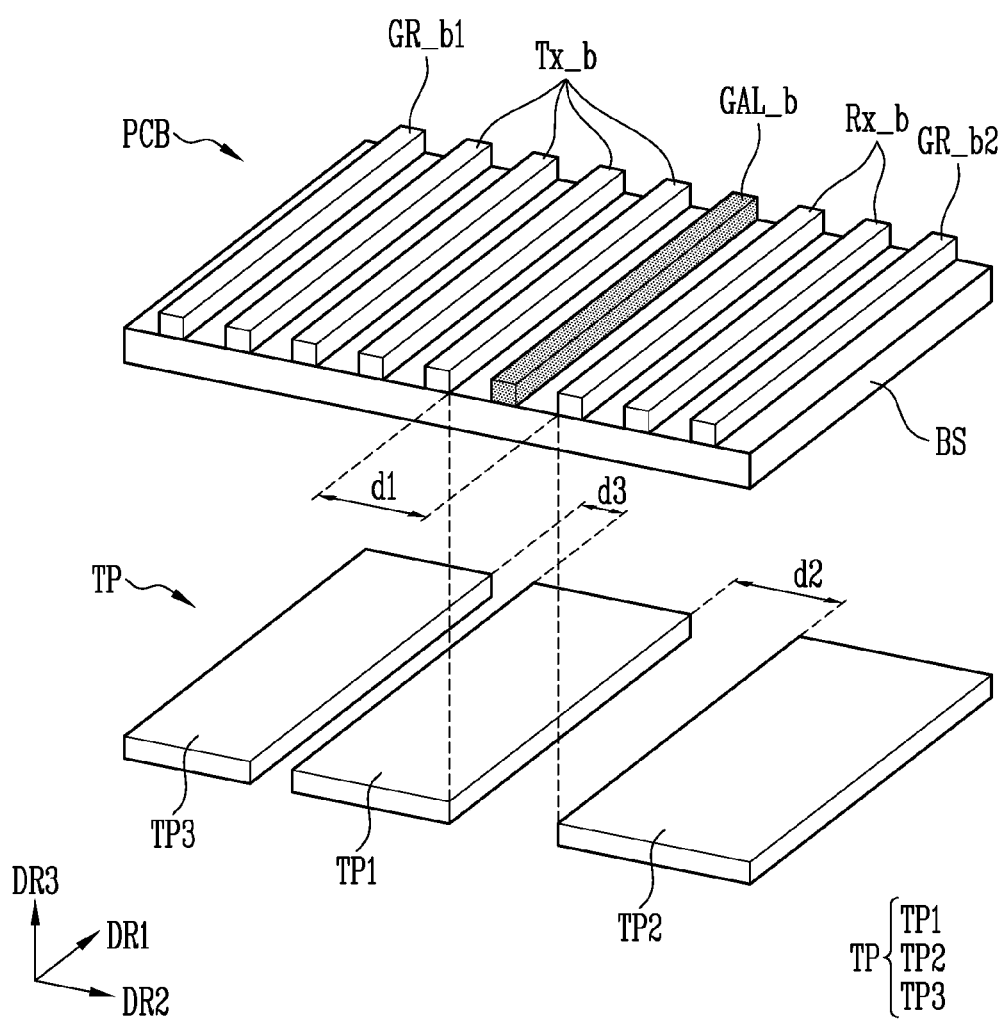
FIGS. 9, 10, and 11 are schematic perspective views illustrating examples of the conductive tape illustrated in FIG. 5 in accordance with different embodiments.
Figure 10:
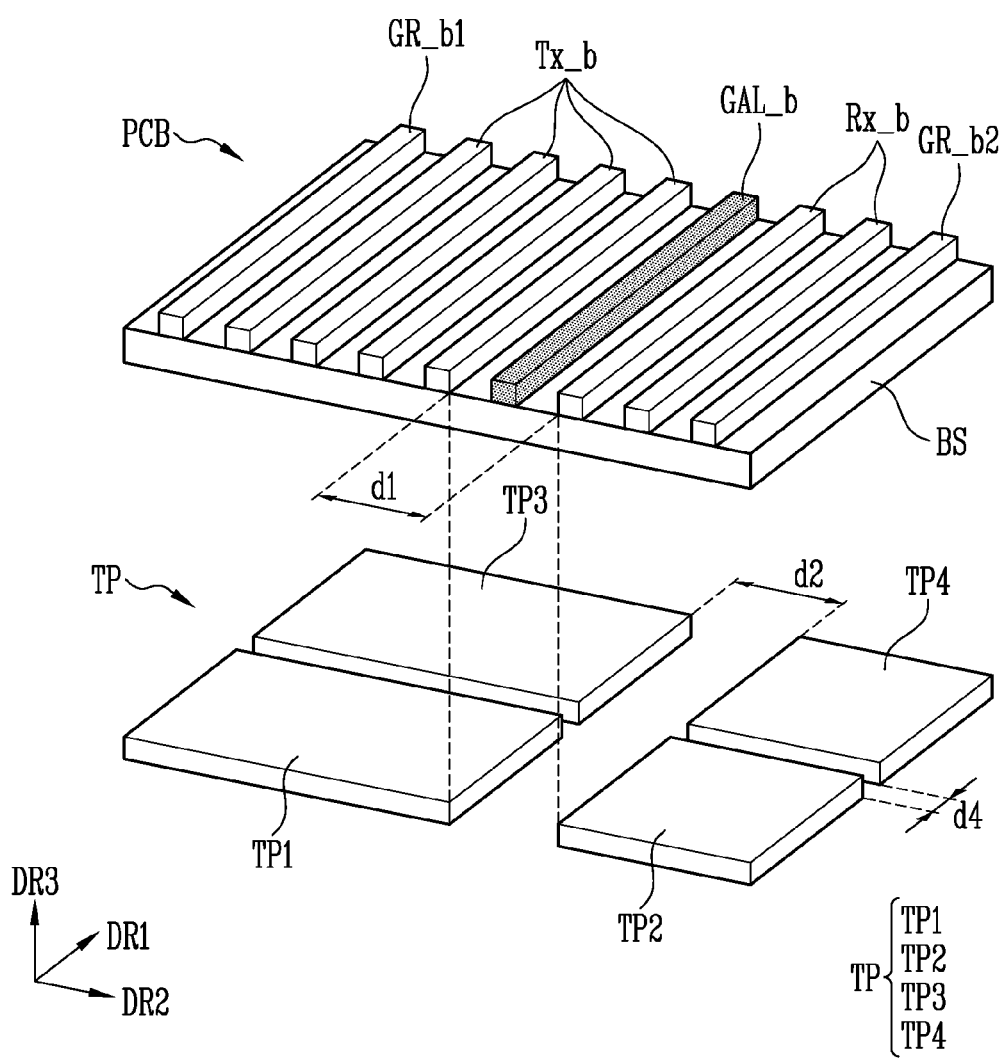
Figure 11:
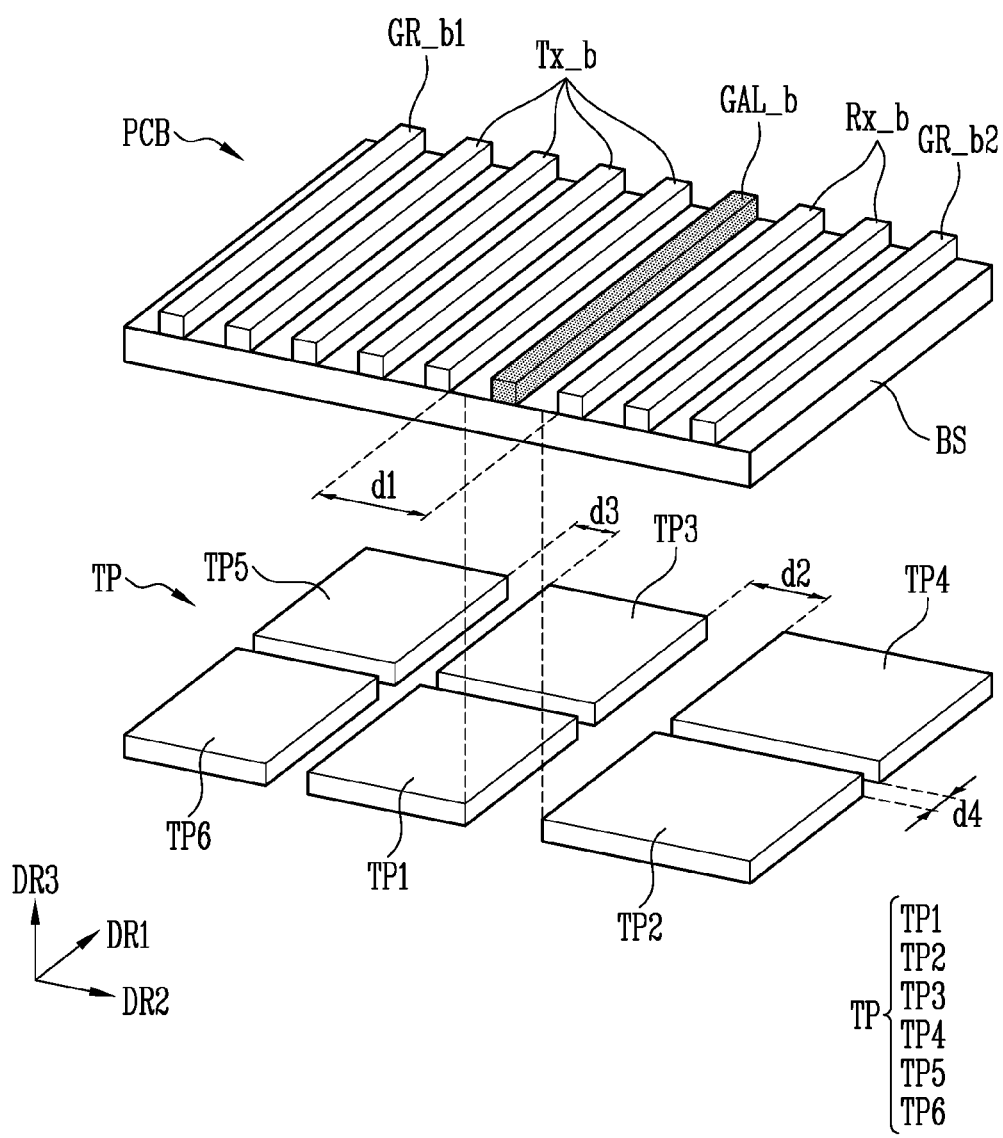

FIGS. 9 to 11 are schematic perspective views illustrating examples of the conductive tape TP illustrated in FIG. 5 in accordance with different embodiments.

Referring to FIGS. 1 to 11, the conductive tape TP in accordance with an embodiment may be divided into several parts spaced apart from each other.

Referring to FIG. 9, the conductive tape TP may include first conductive tape TP1 and second conductive tape TP2 which are spaced apart from each other with a gap d2 interposed therebetween based on a portion corresponding to the first guard line GAL_b. The conductive tape TP may further include third conductive tape TP3 spaced apart from the first and second conductive tape TP1 and TP2. The second conductive tape TP2 and the third conductive tape TP3 may face each other with the first conductive tape TP1 interposed therebetween. For example, the second conductive tape TP2 may be spaced apart from one side (or a right side) of the first conductive tape TP1 in the second direction DR2. The third conductive tape TP3 may be spaced apart from another side (or a left side) of the first conductive tape TP1 in the second direction DR2. Here, the gap d2 between the first conductive tape TP1 and the second conductive tape TP2 may correspond to the first guard line GAL_b of the printed circuit substrate PCB. A gap d3 between the first conductive tape TP1 and the third conductive tape TP3 may not correspond to the first guard line GAL_b.

The gap d2 between the first conductive tape TP1 and the second conductive tape TP2 may be different from the gap d3 between the third conductive tape TP3 and the first conductive tape TP1, but the embodiment described herein is not limited thereto. In an embodiment, the gap d2 between the first and second conductive tape TP1 and TP2 in the second direction DR2 may be identical with the gap d3 between the third and first conductive tape TP3 and TP1 in the second direction DR2.

In case that the conductive tape TP is divided into the first conductive tape TP1, the second conductive tape TP2, and the third conductive tape TP3 that are spaced apart from each other, a noise may be reduced two times by the gap d2 between the first and second conductive tape TP1 and TP2 and the gap d3 between the third and first conductive tape TP3 and TP1. Hence, a ghost touch that may be caused by the noise may be further reduced or prevented.

Furthermore, since the first conductive tape TP1 and the second conductive tape TP2 are spaced apart from each other based on the portion corresponding to the first guard line GAL_b, noise may be prevented from occurring from the gap d2 between the first conductive tape TP1 and the second conductive tape TP2.

Hence, even if a phenomenon in which the conductive tape TP becomes a floating metal layer is caused by a defective connection state of the conductive tape TP, the probability of occurrence of a touch error on the display device DD may be reduced.

In an embodiment, as illustrated in FIG. 10, the conductive tape TP may include first conductive tape TP1 and second conductive tape TP2 spaced apart from each other with a gap d2 therebetween based on a portion corresponding to the first guard line GAL_b, and third conductive tape TP3 and fourth conductive tape TP4 spaced apart from each other with a gap d2 therebetween based on a portion corresponding to the first guard line GAL_b. The first conductive tape TP1 may be spaced apart from the second conductive tape TP2 in the second direction DR2 with the constant gap d2 therebetween. The third conductive tape TP3 may be spaced apart from the fourth conductive tape TP4 in the second direction DR2 with the constant gap d2 therebetween. With respect to the second direction DR2, the gap d2 between the first and second conductive tape TP1 and TP2 may be identical with the gap d2 between the third and fourth conductive tape TP3 and TP4.

The first conductive tape TP1 may be spaced apart from the third conductive tape TP3 in the first direction DR1. The second conductive tape TP2 may be spaced apart from the fourth conductive tape TP4 in the first direction DR1. A gap d4 between the first conductive tape TP1 and the third conductive tape TP3 in the first direction DR1 may not correspond to the first guard line GAL_b. Furthermore, the gap d4 between the second conductive tape TP2 and the fourth conductive tape TP4 in the first direction DR1 may not correspond to the first guard line GAL_b. In an embodiment, the gap d4 between the first and third tape TP1 and TP3 may be identical with the gap d4 between the second and fourth conductive tape TP2 and TP4, but the embodiment described herein is not limited thereto.

The first conductive tape TP1 may face the second conductive tape TP2 in the second direction DR2 and face the third conductive tape TP3 in the first direction DR1. The second conductive tape TP2 may face the first conductive tape TP1 in the second direction DR2 and face the fourth conductive tape TP4 in the first direction DR1. The third conductive tape TP3 may face the first conductive tape TP1 in the first direction DR1 and face the fourth conductive tape TP4 in the second direction DR2. The fourth conductive tape TP4 may face the second conductive tape TP2 in the first direction DR1 and face the third conductive tape TP3 in the second direction DR2.

For example, the first conductive tape TP1 may be spaced apart from one side (or a left side) of the second conductive tape TP2 in the second direction DR2. The third conductive tape TP3 may be spaced apart from one side (or an upper side) of the first conductive tape TP1 in the first direction DR1. The gap d2 between the first and second conductive tape TP1 and TP2 and the gap d2 between the third and fourth conductive tape TP3 and TP4 may correspond to the first guard line GAL_b of the printed circuit substrate PCB.

The gap d4 between the first and third conductive tape TP1 and TP3 and the gap d4 between the second and fourth conductive tape TP2 and TP4 may not correspond to the first guard line GAL_b.

The gap d2 between the first and second conductive tape TP1 and TP2 may be different from the gap d4 between the first and third conductive tape TP1 and TP3 or the gap d4 between the second and fourth conductive tape TP2 and TP4, but the embodiment described herein is not limited thereto. The gap d2 between the third and fourth conductive tape TP3 and TP4 may be different from the gap d4 between the first and third conductive tape TP1 and TP3 or the gap d4 between the second and fourth conductive tape TP2 and TP4, but the embodiment described herein is not limited thereto. In an embodiment, the gap d2 between the first and second conductive tape TP1 and TP2 may be identical with the gap d4 between the first and third conductive tape TP1 and TP3 or the gap d4 between the second and fourth conductive tape TP2 and TP4, but the embodiment described herein is not limited thereto. The gap d2 between the third and fourth conductive tape TP3 and TP4 may be identical with the gap d4 between the first and third conductive tape TP1 and TP3 or the gap d4 between the second and fourth conductive tape TP2 and TP4, but the embodiment described herein is not limited thereto.

The gap d2 between the first and second conductive tape TP1 and TP2 and the gap d2 between the third and fourth conductive tape TP3 and TP4 each may have a width in one direction (e.g., the second direction DR2). The gap d4 between the first and third conductive tape TP1 and TP3 and the gap d4 between the second and fourth conductive tape TP2 and TP4 each may have a width in a direction (e.g., the first direction DR1) different from the one direction. However, the embodiment described herein is not limited thereto.

Since the conductive tape TP is divided into the first conductive tape TP1, the second conductive tape TP2, the third conductive tape TP3, and the fourth conductive tape TP4 that are spaced apart from each other, a noise may be reduced by the gap d2 between the first and second conductive tape TP1 and TP2 and the gap d2 between the third and fourth conductive tapes TP3 and TP4, and the noise may be reduced once more by the gap d4 between the first and third conductive tape TP1 and TP3 and the gap d4 between the second and fourth conductive tape TP2 and TP4. Since the noise is reduced twice, a ghost touch that may be caused by the noise may be further mitigated or prevented.

Furthermore, the first conductive tape TP1 and the second conductive tape TP2 may be spaced apart from each other based on the portion corresponding to the first guard line GAL_b. The third conductive tape TP3 and the fourth conductive tape TP4 may be spaced apart from each other based on the portion corresponding to the first guard line GAL_b. Therefore, another noise may be prevented from occurring from the gap d2 between the first and second conductive tape TP1 and TP2 and the gap d2 between the third and fourth conductive tape TP3 and TP4.

Hence, even if a phenomenon in which the conductive tape TP becomes a floating metal layer is caused by a defective connection state of the conductive tape TP, the probability of occurrence of a touch error on the display device DD may be reduced.

In an embodiment, as illustrated in FIG. 11, the conductive tape TP may include first conductive tape TP1 and second conductive tape TP2 spaced apart from each other with a gap d2 therebetween based on a portion corresponding to the first guard line GAL_b, and third conductive tape TP3 and fourth conductive tape TP4 spaced apart from each other with a gap d2 therebetween based on a portion corresponding to the first guard line GAL_b. Furthermore, the conductive tape TP may further include fifth conductive tape TP5 and sixth conductive tape TP6 spaced apart from each other with a gap d3 therebetween based on a portion that does not correspond to the guard line GAL_b.

The first conductive tape TP1 may be spaced apart from the second conductive tape TP2 in the second direction DR2 with the constant gap d2 therebetween. The third conductive tape TP3 may be spaced apart from the fourth conductive tape TP4 in the second direction DR2 with the constant gap d2 therebetween. With respect to the second direction DR2, the gap d2 between the first and second conductive tape TP1 and TP2 may be identical with the gap d2 between the third and fourth conductive tape TP3 and TP4. The first conductive tape TP1 may be spaced apart from the sixth conductive tape TP6 in the second direction DR2 with the constant gap d3 therebetween. The third conductive tape TP3 may be spaced apart from the fifth conductive tape TP5 in the second direction DR2 with the constant gap d3 therebetween. With respect to the second direction DR2, the gap d3 between the first and sixth conductive tape TP1 and TP6 may be identical with the gap d3 between the third and fifth conductive tape TP3 and TP5.

The first conductive tape TP1 may be spaced apart from the third conductive tape TP3 in the first direction DR1. The second conductive tape TP2 may be spaced apart from the fourth conductive tape TP4 in the first direction DR1. The sixth conductive tape TP2 may be spaced apart from the fifth conductive tape TP5 in the first direction DR1. The gap d4 between the first conductive tape TP1 and the third conductive tape TP3 in the first direction DR1 may not correspond to the first guard line GAL_b. The gap d4 between the second conductive tape TP2 and the fourth conductive tape TP4 in the first direction DR1 may not correspond to the first guard line GAL_b. The gap d4 between the sixth conductive tape TP6 and the fifth conductive tape TP5 in the first direction DR1 may not correspond to the first guard line GAL_b. In an embodiment, the gap d4 between the first and third tape TP1 and TP3, the gap d4 between the second and fourth conductive tape TP2 and TP4, and the gap d4 between the sixth and fifth tape TP6 and TP5 may be identical with each other, but the embodiment described herein is not limited thereto.

The first conductive tape TP1 may face the second conductive tape TP2 at one side in the second direction DR2, and face the sixth conductive tape TP6 at another side in the second direction DR2. Furthermore, the first conductive tape TP1 may face the third conductive tape TP3 in the first direction DR1. The second conductive tape TP2 may face the first conductive tape TP1 in the second direction DR2 and face the fourth conductive tape TP4 in the first direction DR1. The third conductive tape TP3 may face the fourth conductive tape TP4 at one side in the second direction DR2, and face the fifth conductive tape TP5 at another side in the second direction DR2. Furthermore, the third conductive tape TP3 may face the first conductive tape TP1 in the first direction DR1. The fourth conductive tape TP4 may face the second conductive tape TP2 in the first direction DR1 and face the third conductive tape TP3 in the second direction DR2. The fifth conductive tape TP5 may face the sixth conductive tape TP6 in the first direction DR1 and face the third conductive tape TP3 in the second direction DR2. The sixth conductive tape TP6 may face the fifth conductive tape TP5 in the first direction DR1 and face the first conductive tape TP1 in the second direction DR2.

For example, the first conductive tape TP1 may be spaced apart from one side (or a left side) of the second conductive tape TP2 in the second direction DR2, and be spaced apart from one side (or a right side) of the sixth conductive tape TP6 in the second direction DR2. The third conductive tape TP3 may be spaced apart from one side (or an upper side) of the first conductive tape TP1 in the first direction DR1. Furthermore, the third conductive tape TP3 may be spaced apart from one side (or a left side) of the fourth conductive tape TP4 in the second direction DR2, and be spaced apart from one side (or a right side) of the fifth conductive tape TP5 in the second direction DR2. The first conductive tape TP1 may be spaced apart from one side (or a lower side) of the third conductive tape TP3 in the first direction DR1. With respect to the second direction DR2, the gap d2 between the first and second conductive tape TP1 and TP2 and the gap d2 between the third and fourth conductive tape TP3 and TP4 may correspond to the first guard line GAL_b of the printed circuit substrate PCB. With respect to the second direction DR2, the gap d3 between the first and sixth conductive tape TP1 and TP6 and the gap d3 between the third and fifth conductive tape TP3 and TP5 may not correspond to the first guard line GAL_b. With respect to the first direction DR1, the gap d4 between the first and third conductive tape TP1 and TP3, the gap d4 between the sixth and fourth conductive tape TP3 and TP4, and the gap d4 between the sixth and fifth conductive tape TP6 and TP5 may not correspond to the first guard line GAL_b.

The gap d2 between the first and second conductive tape TP1 and TP2 may be different from the gap d4 between the first and third conductive tape TP1 and TP3, the gap d4 between the second and fourth conductive tape TP2 and TP4, or the gap d4 between the sixth and fifth conductive tape TP6 and TP5, but the embodiment described herein is not limited thereto. The gap d2 between the third and fourth conductive tape TP3 and TP4 may be different from the gap d4 between the first and third conductive tape TP1 and TP3, the gap d4 between the second and fourth conductive tape TP2 and TP4, or the gap d4 between the sixth and fifth conductive tape TP6 and TP5, but the embodiment described herein is not limited thereto. Furthermore, the gap d2 between the first and second conductive tape TP1 and TP2 may be different from the gap d3 between the first and sixth conductive tape TP1 and TP6 or the gap d3 between the third and fifth conductive tape TP3 and TP5, but the embodiment described herein is not limited thereto. The gap d2 between the third and fourth conductive tape TP3 and TP4 may be different from the gap d3 between the first and sixth conductive tape TP1 and TP6 or the gap d3 between the third and fifth conductive tape TP3 and TP5, but the embodiment described herein is not limited thereto.

In an embodiment, the gap d2 between the first and second conductive tape TP1 and TP2 may be identical with the gap d4 between the first and third conductive tape TP1 and TP3, the gap d4 between the second and fourth conductive tape TP2 and TP4, or the gap d4 between the sixth and fifth conductive tape TP6 and TP5, but the embodiment described herein is not limited thereto. The gap d2 between the third and fourth conductive tape TP3 and TP4 may be different from the gap d4 between the first and third conductive tape TP1 and TP3, the gap d4 between the second and fourth conductive tape TP2 and TP4, or the gap d4 between the sixth and fifth conductive tape TP6 and TP5, but the embodiment described herein is not limited thereto. Furthermore, the gap d2 between the first and second conductive tape TP1 and TP2 may be identical with the gap d3 between the first and sixth conductive tape TP1 and TP6 or the gap d3 between the third and fifth conductive tape TP3 and TP5, but the embodiment described herein is not limited thereto. The gap d2 between the third and fourth conductive tape TP3 and TP4 may be identical with the gap d3 between the first and sixth conductive tape TP1 and TP6 or the gap d3 between the third and fifth conductive tape TP3 and TP5, but the embodiment described herein is not limited thereto.

The gap d2 between the first and second conductive tape TP1 and TP2 and the gap d2 between the third and fourth conductive tape TP3 and TP4 each may have a width in one direction (e.g., the second direction DR2). The gap d4 between the first and third conductive tape TP1 and TP3, the gap d4 between the second and fourth conductive tape TP2 and TP4, and the gap d4 between the sixth and fifth conductive tape TP6 and TP5 each may have a width in a direction (e.g., the first direction DR1) different from the one direction. The gap d3 between the first and sixth conductive tape TP1 and TP6 and the gap d3 between the third and fifth conductive tape TP3 and TP5 each may have a width in a direction (e.g., the second direction DR2) identical with the one direction. However, the embodiment described herein is not limited thereto.

As such, the conductive tape TP may be divided into the first conductive tape TP1, the second conductive tape TP2, the third conductive tape TP3, the fourth conductive tape TP4, the fifth conductive tape TP5, and the sixth conductive tape TP6 that are spaced apart from each other. Hence, a noise may be reduced by the gap d2 between the first and second conductive tape TP1 and TP2 and the gap d2 between the third and fourth conductive tapes TP3 and TP4. The noise may be reduced once more by the gap d4 between the first and third conductive tape TP1 and TP3, the gap d4 between the second and fourth conductive tape TP2 and TP4, and the gap d4 between the sixth and fifth conductive tape TP6 and TP5. The noise may be reduced once more by the gap d3 between the first and sixth conductive tape TP1 and TP6 and the gap d3 between the third and fifth conductive tape TP3 and TP5. Since the noise is reduced three times, a ghost touch that may be caused by the noise may be further mitigated or prevented.

Furthermore, the first conductive tape TP1 and the second conductive tape TP2 may be spaced apart from each other based on the portion corresponding to the first guard line GAL_b. The third conductive tape TP3 and the fourth conductive tape TP4 may be spaced apart from each other based on the portion corresponding to the first guard line GAL_b. Therefore, another noise may be prevented from occurring from the gap d2 between the first and second conductive tape TP1 and TP2 and the gap d2 between the third and fourth conductive tape TP3 and TP4.

Hence, even if a phenomenon in which the conductive tape TP becomes a floating metal layer is caused by a defective connection state of the conductive tape TP, the probability of occurrence of a touch error on the display device DD may be reduced.

In the drawings, there are illustrated examples where the conductive tape TP may be divided up to six parts, but the embodiment described herein is not limited thereto. As the number of parts formed by dividing the conductive tape TP and spaced apart from each other is increased, the magnitude of a noise may be reduced. However, to increase the efficiency of the process, the number of parts formed by dividing the conductive tape TP may be appropriately adjusted rather than unconditionally increasing the number of parts.

Furthermore, the direction in which the conductive tape TP is divided is not particularly limited to the foregoing directions. The conductive tape TP may be divided into additional several directions so long as one direction of the portion corresponding to the first guard line GAL_b is included therein. A plurality of pieces of conductive tape obtained by dividing the conductive tape TP several times each may electrically connected to one or more ground terminals GR.

In a case in which a plurality of first guard lines GAL_b are provided, the conductive tape TP may be divided into a plurality of parts corresponding to the plurality of first guard lines GAL_b. Here, the conductive tape TP may be divided into parts with a plurality of constant gaps d2 corresponding to the plurality of first guard lines GAL_b. The gaps d2 may correspond to a plurality of distances d1 of a plurality of first signal lines Tx_b and a plurality of second signal lines Rx_b with the plurality of first guard lines GAL_b interposed therebetween.

Since the conductive tape TP is divided into several parts spaced apart from each other based on portions corresponding to the plurality of first guard lines GAL_b, the magnitude of the noise may be further reduced. Hence, a ghost touch that may be caused by the noise may be further reduced or prevented.

Furthermore, another noise may be further prevented from occurring from the gaps between the plurality of pieces of conductive tape formed by dividing the conductive tape TP several times.

Hence, even if a phenomenon in which the conductive tape TP becomes a floating metal layer is caused by a defective connection state of the conductive tape TP, the probability of occurrence of a touch error on the display device DD may be reduced.

Referring again to FIG. 11, since the conductive tape TP is divided into the first conductive tape TP1, the second conductive tape TP2, the third conductive tape TP3, the fourth conductive tape TP4, the fifth conductive tape TP5, and the sixth conductive tape TP6 that are spaced apart from each other, the noise may be reduced several times by the gaps d2, d3, and d4 between the conductive tape TP1 to TP6. Hence, a ghost touch that may be caused by the noise may be further reduced or prevented.

The gaps d2, d3, and d4 between the conductive tape TP may be identical with each other, or different from each other. As the gaps d2, d3, and d4 between the conductive tape TP increase, the magnitude of a noise caused by the floating metal layer may be reduced. Therefore, the gaps d2, d3, and d4 between the conductive tape TP may be sufficiently large. Since the gaps d2, d3, and d4 between the conductive tape TP are sufficiently large, the ghost touch that may be caused by the noise may be further reduced or prevented.

Figure 12:
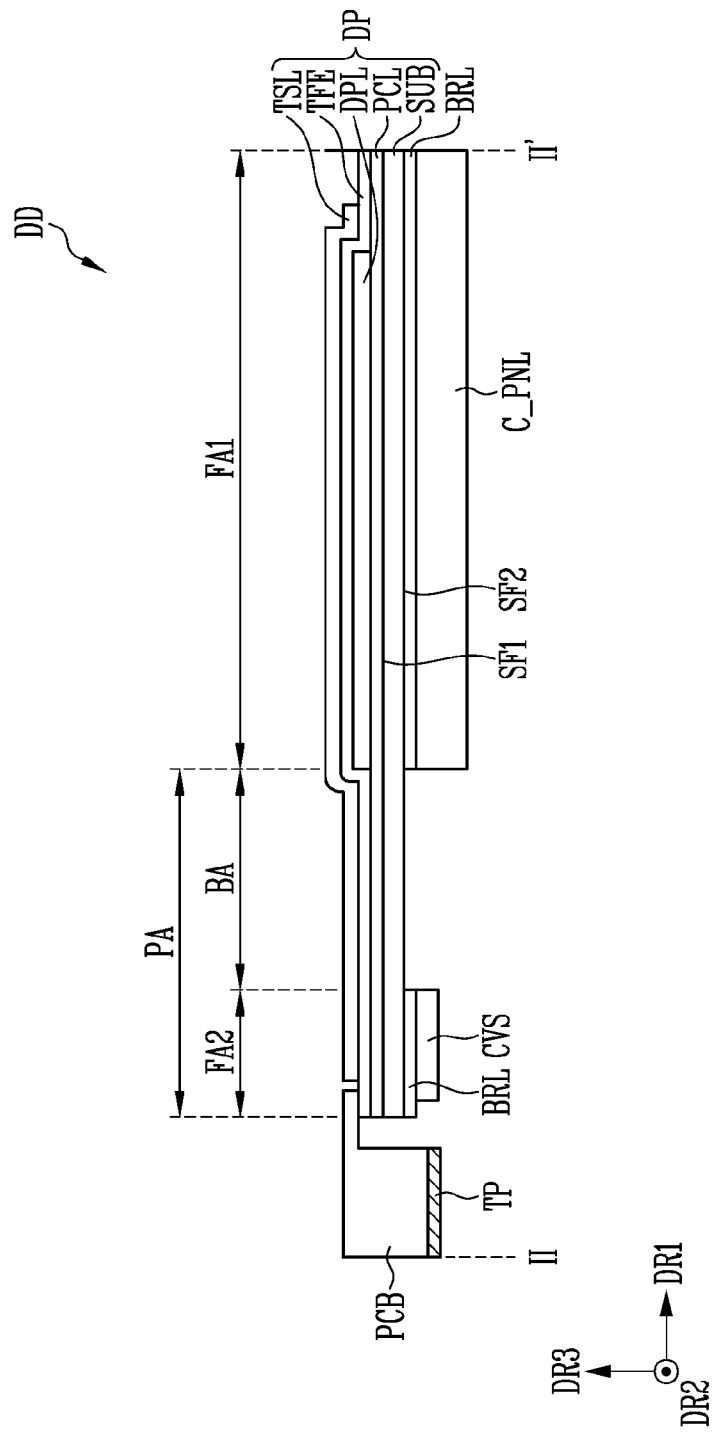
FIG. 12 is a sectional view taken along line II-IF of FIG. 1.
Figure 13:
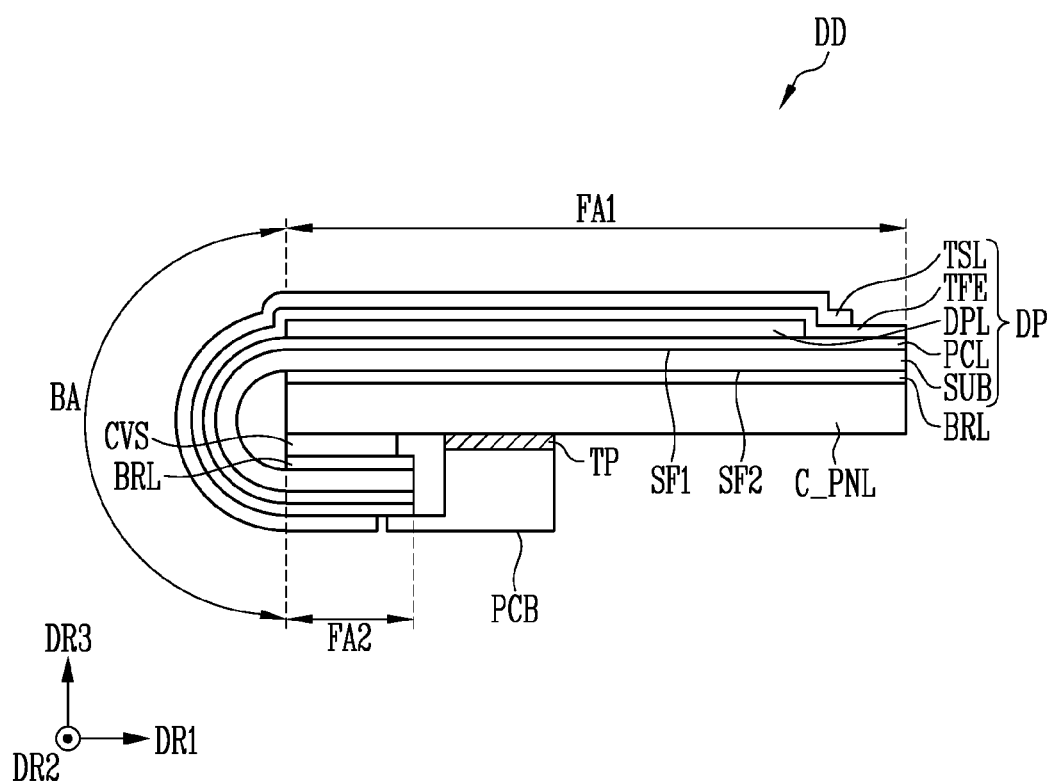
FIG. 13 is a sectional view illustrating the printed circuit substrate attached to the cover panel by the conductive tape by bending the display device of FIG. 12.
Figure 14:
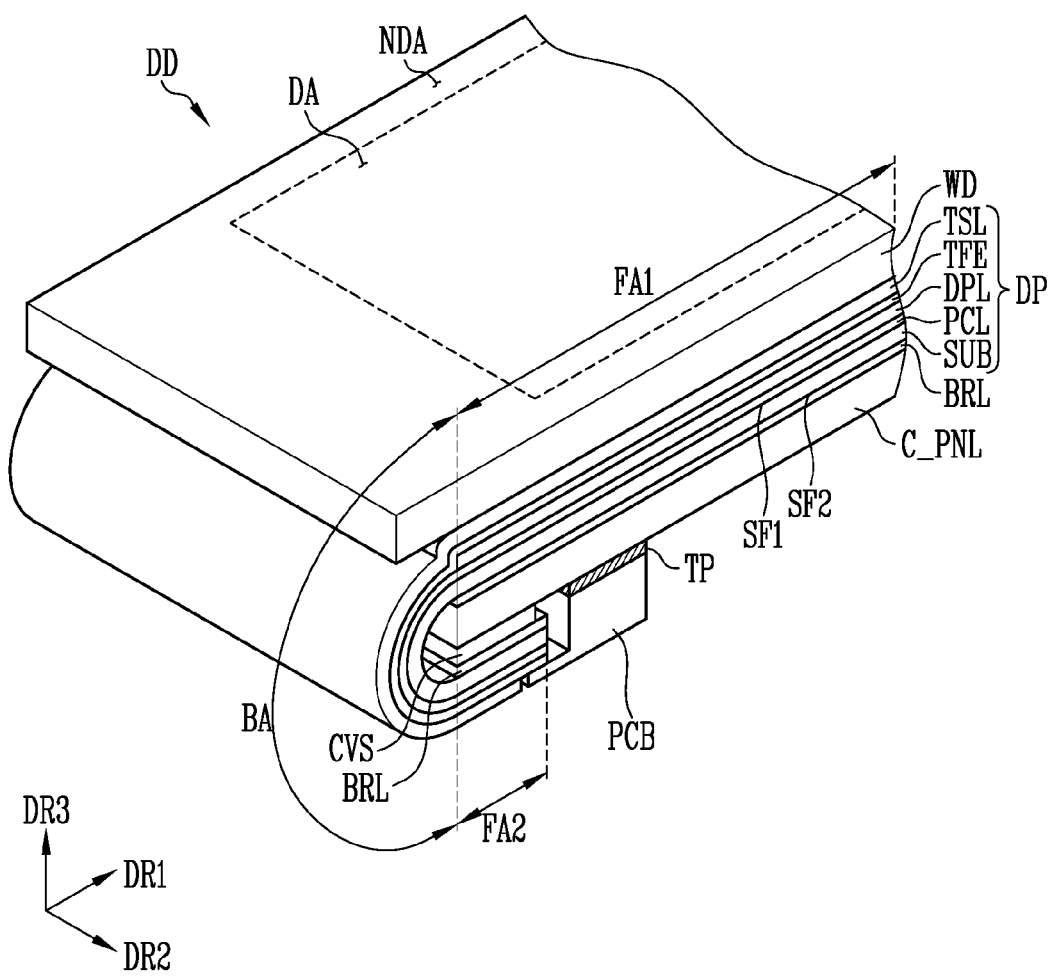
FIG. 14 is a perspective view illustrating in detail a portion of the display device illustrated in FIG. 2.

FIG. 12 is a sectional view taken along line II-IF of FIG. 1. FIG. 13 is a sectional view illustrating the printed circuit substrate PCB attached to the cover panel C_PNL by the conductive tape TP by bending the display device DD of FIG. 12. FIG. 14 is a perspective view illustrating in detail a portion of the display device DD illustrated in FIG. 2.

Referring to FIGS. 12 and 13, the display device DD in accordance with an embodiment may include a printed circuit substrate PCB attached to a distal end of the protrusion area PA. The conductive tape TP may be attached to the printed circuit substrate PCB. In an embodiment, the display device DD may further include a passivation layer BRL and a cover spacer CVS.

The passivation layer BRL may be disposed on a lower surface of the display panel DP, e.g., on the lower surface of the substrate SUB.

The passivation layer BRL may be provided to correspond to each of the first flat area FA1 and the second flat area FA2. Hereinafter, for the sake of explanation, the passivation layer BRL that corresponds to the first flat area FA1 will be designated as a first passivation layer BRL, and the passivation layer BRL that corresponds to the second flat area FA2 will be designated as a second passivation layer BRL.

The first passivation layer BRL and the second passivation layer BRL may be separated from each other with the bending area BA interposed therebetween. The first passivation layer BRL and the second passivation layer BRL may face each other when the display panel DP is bent. In an embodiment, to minimize stress generated when the display panel DP is bent, the passivation layer BRL may not be provided in the bending area BA. However, the embodiment described herein is not limited thereto, and the passivation layer BRL may also be provided in the bending area BA.

The first passivation layer BRL may be provided and/or formed on an upper surface of the cover panel C_PNL. The second passivation layer BRL may be provided and/or formed on a lower surface (or a rear surface) of the cover panel C_PNL with the cover spacer CVS interposed therebetween.

The cover spacer CVS may maintain, when the display panel DP is bent, constant space between the cover panel C_PNL and a portion of the display panel DP that corresponds to the second flat area FA2, so that the degree to which the display panel DP is bent (or curved) can be controlled. Furthermore, the cover spacer CVS may support some components of the display panel DP that correspond to the second flat area FA2 when the first flat area FA1 and the second flat area FA2 face each other by bending the display panel DP. In an embodiment, the cover spacer CVS may include material identical with that of the cushion layer described above, but the embodiment described herein is not limited thereto. The cover spacer CVS may include material corresponding to design conditions, etc. of the display panel DP among elastic materials.

The cover spacer CVS may function to mitigate external impact, and include elastically deformable material. For example, the cover spacer CVS may include thermoplastic elastomer, polystyrene, polyolefin, polyurethane thermoplastic elastomers, polyamides, synthetic rubbers, polydimethylsiloxane, polybutadiene, polyisobutylene, poly(styrene-butadienestyrene), polyurethanes, polychloroprene, polyethylene, silicone, and a combination thereof, but the embodiment described herein is not limited to the foregoing examples. For instance, the cover spacer CVS may include suitable material selected from among materials having elasticity within a range in which the material does not affect image display performance of the display panel DP.

The cover spacer CVS may be formed of a signal layer, but the embodiment described herein is not limited thereto. The cover spacer CVS may have a multilayer structure formed by stacking a plurality of separate layers.

Referring to FIGS. 13 and 14, in the display device DD in accordance with an embodiment, the printed circuit substrate PCB may be attached to the cover panel C_PNL by the conductive tape TP by bending the bending area BA.

Referring to FIG. 14, in the display device DD, a window WD may be disposed in a frontal direction of the display device DD (e.g., in a direction in which an image is displayed). In an embodiment, the window WD may be provided to correspond to the first flat area FA1 and a portion of the bending area BA.

The window WD may minimize defects of the display device DD which may be caused by an external impact. The window WD may cover both the display area DA and the non-display area NDA.

The window WD may provide an input surface and/or a display surface to the user. The window WD may be joined with the display panel DP by an optical transparent adhesive OCA.

The window WD may have a multilayer structure including at least one selected from among a glass substrate, a plastic film, and a plastic substrate. The multilayer structure may be formed through a successive process or an adhesion process using an adhesive layer. The window WD may entirely or partially have flexibility.

In accordance with an embodiment, a ghost touch that may occur in case that conductive tape is not reliably attached to a desired portion may be reduced or prevented. Furthermore, since the ghost touch is reduced or prevented, a display device having a low defect rate may be provided.

The effects of embodiments described hereinabove are not limited by the foregoing, and other various effects are anticipated herein.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, and including at least one first touch electrode and at least one second touch electrode;
   a printed circuit substrate connected to one side of the non-display area and electrically connected with the plurality of pixels; and
   conductive tape attached to one surface of the printed circuit substrate,
   wherein the conductive tape comprises first conductive tape and second conductive tape spaced apart from each other,
   wherein the printed circuit substrate comprises:
      a base layer;
      a driving circuit mounted on the base layer and electrically connected with the first and the second touch electrodes;
      at least one ground terminal disposed on the base layer;
      at least one first signal line disposed on the base layer and configured to electrically connect the driving circuit with the first touch electrode;
      at least one second signal line disposed on the base layer and configured to electrically connect the driving circuit with the second touch electrode;
      at least one first guard line disposed on the base layer between the first signal line and the second signal line; and
   at least one first ground line electrically connected to the ground terminal.

2. The display device according to claim 1, wherein a gap between the first conductive tape and the second conductive tape corresponds to the first guard line.

3. The display device according to claim 2, wherein each of the first conductive tape and the second conductive tape is electrically connected to the ground terminal.

4. The display device according to claim 2, wherein the first signal line, the second signal line, and the first guard line, and the first ground line are electrically separated from each other.

5. The display device according to claim 4,
wherein the touch sensing layer includes a touch sensing area in which the first and the second touch electrodes are disposed, and a touch peripheral area configured to enclose at least one side of the touch sensing area, and
wherein at least one first sensing line electrically connected to the first touch electrode and the first signal line, at least one second sensing line electrically connected to the second touch electrode and he second signal line, at least one second guard line electrically connected to the first guard line, and at least one second ground line electrically connected to the first ground line are disposed in the touch peripheral area.

6. The display device according to claim 5, wherein the first sensing line, the second sensing line, the second guard line, and the second ground line are disposed in the touch peripheral area at positions spaced apart from each other.

7. The display device according to claim 5,
wherein the first signal line and the second signal line face each other with the first guard line interposed therebetween on the base layer, and
wherein a distance between the first signal line and the second signal line with the first guard line interposed therebetween is 50 µm or more.

8. The display device according to claim 5, wherein a gap between the first conductive tape and the second conductive tape is 50 µm or more.

9. The display device according to claim 8, wherein the gap between the first conductive tape and the second conductive tape is identical with or less than a distance between the first signal line and the second signal line with the first guard line interposed therebetween.

10. The display device according to claim 5, wherein the display panel comprises:
a substrate including a first surface and a second surface that face each other;
the plurality of pixels disposed on the first surface of the substrate; and
a cover panel disposed on the second surface of the substrate,
wherein each of the first and the second conductive tape is disposed between one surface of the cover panel and the printed circuit substrate.

11. The display device according to claim 10, wherein the printed circuit substrate further comprises an insulating layer provided on the first and the second signal lines, the first guard line, and the first ground line.

12. The display device according to claim 2,
wherein the conductive tape further comprises third conductive tape spaced apart from the first and the second conductive tape, and
wherein each of the first to the third conductive tape is electrically connected to the ground terminal.

13. The display device according to claim 12,
wherein the conductive tape further comprises fourth conductive tape spaced apart from the first to the third conductive tape, and
wherein each of the first to the fourth conductive tape is electrically connected to the ground terminal.

14. The display device according to claim 10, wherein the printed circuit substrate comprises a flexible printed circuit substrate.

15. The display device according to claim 14, wherein the display panel includes a first flat area, a second flat area, and a bending area.

16. The display device according to claim 15, further comprising a passivation layer provided on an upper surface of the cover panel in the first flat area, and provided to face a rear surface of the cover panel in the second flat area.

17. The display device according to claim 16, further comprising a cover spacer provided in the second flat area between the passivation layer and the cover panel.

18. The display device according to claim 17, wherein the bending area is bent so that the printed circuit substrate is attached to the cover panel by the conductive tape.

19. A display device comprising:
a display panel including: a) a display area that includes a plurality of pixels, and b) a non-display area formed to enclose at least one side of the display area;
a touch sensing layer disposed on the display panel;
a printed circuit substrate connected to the non-display area and electrically connected with the plurality of pixels; and
conductive tape attached to the printed circuit substrate, wherein the conductive tape comprises first conductive tape and second conductive tape spaced apart from each other by a gap,
wherein the printed circuit substrate comprises:
a base layer;
a driving circuit mounted on the base layer and electrically connected with the first and the second touch electrodes;
at least one ground terminal disposed on the base layer;
at least one first signal line disposed on the base layer and configured to electrically connect the driving circuit with the first touch electrode;
at least one second signal line disposed on the base layer and configured to electrically connect the driving circuit with the second touch electrode;
at least one first guard line disposed on the base layer between the first signal line and the second signal line; and
at least one first ground line electrically connected to the ground terminal.

* * * * *